(12) United States Patent
Adamchuk et al.

(10) Patent No.: US 11,549,035 B2
(45) Date of Patent: Jan. 10, 2023

(54) DIELECTRIC SUBSTRATE AND METHOD OF FORMING THE SAME

(71) Applicant: SAINT-GOBAIN PERFORMANCE PLASTICS CORPORATION, Solon, OH (US)

(72) Inventors: Jennifer Adamchuk, Marlborough, MA (US); Dale Thomas, Rochdale (GB); Meghann White, Bedford, NH (US); Sethumadhavan Ravichandran, Shrewsbury, MA (US); Gerard T. Buss, Bedford, NH (US)

(73) Assignee: SAINT-GOBAIN PERFORMANCE PLASTICS CORPORATION, Solon, OH (US)

( * ) Notice: Subject to any disclaimer, the term of this patent is extended or adjusted under 35 U.S.C. 154(b) by 0 days.

(21) Appl. No.: 17/643,446

(22) Filed: Dec. 9, 2021

(65) Prior Publication Data
US 2022/0186081 A1    Jun. 16, 2022

Related U.S. Application Data

(60) Provisional application No. 63/126,105, filed on Dec. 16, 2020.

(51) Int. Cl.
*C09J 7/24* (2018.01)
*C09J 11/04* (2006.01)
(Continued)

(52) U.S. Cl.
CPC ............. *C09J 7/245* (2018.01); *B32B 7/12* (2013.01); *B32B 15/08* (2013.01); *B32B 15/20* (2013.01);
(Continued)

(58) Field of Classification Search
CPC ............................................. B32B 2307/204
See application file for complete search history.

(56) References Cited

U.S. PATENT DOCUMENTS

| | | |
|---|---|---|
| 4,335,180 A | 6/1982 | Traut |
| 4,634,631 A | 1/1987 | Gazit et al. |
| (Continued) | | |

FOREIGN PATENT DOCUMENTS

| | | |
|---|---|---|
| CN | 101365294 B | 6/2010 |
| CN | 102471590 B | 5/2012 |
| (Continued) | | |

OTHER PUBLICATIONS

International Search Report and Written Opinion for PCT Application No. PCT/US2021/072819, dated Mar. 31, 2022, 9 pages.
(Continued)

*Primary Examiner* — Ian A Rummel
(74) *Attorney, Agent, or Firm* — Abel Schillinger, LLP; Chi Suk Kim

(57) ABSTRACT

The present disclosure relates to a dielectric substrate that may include a polymer based core film, and a fluoropolymer based adhesive layer. The polymer based core film may include a resin matrix component, and a ceramic filler component. The ceramic filler component may include a first filler material. The particle size distribution of the first filler material may have a $D_{10}$ of at least about 1.0 microns and not greater than about 1.7, a $D_{50}$ of at least about 1.0 microns and not greater than about 3.5 microns, and a $D_{90}$ of at least about 2.7 microns and not greater than about 6 microns.

20 Claims, 6 Drawing Sheets

(51) Int. Cl.
*C09J 7/38* (2018.01)
*H05K 1/09* (2006.01)
*H05K 1/03* (2006.01)
*B32B 7/12* (2006.01)
*B32B 27/20* (2006.01)
*B32B 15/20* (2006.01)
*B32B 15/08* (2006.01)
*B32B 27/28* (2006.01)

(52) U.S. Cl.
CPC ............ *B32B 27/20* (2013.01); *B32B 27/281* (2013.01); *C09J 7/381* (2018.01); *C09J 11/04* (2013.01); *H05K 1/0373* (2013.01); *H05K 1/09* (2013.01); *B32B 2255/10* (2013.01); *B32B 2255/26* (2013.01); *B32B 2264/1021* (2020.08); *B32B 2307/204* (2013.01); *B32B 2307/732* (2013.01); *B32B 2457/08* (2013.01); *C09J 2203/326* (2013.01); *C09J 2301/41* (2020.08); *C09J 2400/166* (2013.01); *C09J 2427/00* (2013.01); *C09J 2427/006* (2013.01); *H05K 2201/0209* (2013.01)

(56) References Cited

U.S. PATENT DOCUMENTS

| | | | |
|---|---|---|---|
| 4,647,508 | A | 3/1987 | Gazit et al. |
| 4,661,301 | A | 4/1987 | Okada et al. |
| 4,784,901 | A | 11/1988 | Hatakeyama et al. |
| 4,849,284 | A | 7/1989 | Arthur et al. |
| 4,987,274 | A | 1/1991 | Miller et al. |
| 5,055,342 | A | 10/1991 | Markovich et al. |
| 5,061,548 | A | 10/1991 | Arthur et al. |
| 5,075,065 | A | 12/1991 | Effenberger et al. |
| 5,194,326 | A | 3/1993 | Arthur et al. |
| 5,281,466 | A | 1/1994 | Arthur et al. |
| 5,312,576 | A | 5/1994 | Swei et al. |
| 5,354,611 | A | 10/1994 | Arthur et al. |
| 5,374,453 | A | 12/1994 | Swei et al. |
| 5,384,181 | A | 1/1995 | Arthur et al. |
| 5,440,805 | A | 8/1995 | Daigle et al. |
| 5,506,049 | A | 4/1996 | Swei et al. |
| 5,889,104 | A | 3/1999 | Rosenmayer |
| 5,922,453 | A | 7/1999 | Horn, III et al. |
| 6,172,139 | B1 | 1/2001 | Swei et al. |
| 6,373,717 | B1 | 4/2002 | Downes, Jr. et al. |
| 6,500,529 | B1 | 12/2002 | McCarthy et al. |
| 7,981,504 | B2 | 7/2011 | Nelson |
| 8,187,696 | B2 | 5/2012 | Paul et al. |
| 8,314,005 | B2 | 11/2012 | Purushothaman et al. |
| 8,530,746 | B2 | 9/2013 | Zheng et al. |
| 8,835,770 | B2 | 9/2014 | Oyama et al. |
| 9,258,892 | B2 | 2/2016 | Crosley |
| 9,462,688 | B2 | 10/2016 | Park et al. |
| 10,096,398 | B2 | 10/2018 | Janah et al. |
| 2004/0109298 | A1 | 6/2004 | Hartman et al. |
| 2005/0244662 | A1 | 11/2005 | Horn, III et al. |
| 2006/0062976 | A1 | 3/2006 | Sohn et al. |
| 2007/0206364 | A1 | 9/2007 | Swei et al. |
| 2009/0038828 | A1 | 2/2009 | Hou et al. |
| 2009/0128912 | A1 | 5/2009 | Okada et al. |
| 2010/0015404 | A1 | 1/2010 | Paul et al. |
| 2012/0069288 | A1 | 3/2012 | Das et al. |
| 2012/0123021 | A1 | 5/2012 | Yano et al. |
| 2013/0163253 | A1 | 6/2013 | Saito et al. |
| 2015/0030824 | A1 | 1/2015 | Crosley |
| 2015/0195921 | A1 | 7/2015 | Onodera et al. |
| 2016/0113113 | A1 | 4/2016 | Sethumadhavan et al. |
| 2016/0242274 | A1 | 8/2016 | Hosoda et al. |
| 2016/0280979 | A1 | 9/2016 | Uchiyama et al. |
| 2017/0145182 | A1 | 5/2017 | Horn, III et al. |
| 2017/0273188 | A1 | 9/2017 | Su |
| 2018/0019177 | A1 | 1/2018 | Harada et al. |
| 2018/0052488 | A1 | 2/2018 | Posner et al. |
| 2018/0339493 | A1 | 11/2018 | Chen et al. |
| 2019/0136109 | A1 | 5/2019 | Agapov et al. |
| 2020/0053877 | A1 | 2/2020 | Liu et al. |
| 2020/0404782 | A1 | 12/2020 | Chen et al. |
| 2022/0033617 | A1 | 2/2022 | Adamchuk et al. |
| 2022/0039254 | A1 | 2/2022 | Adamchuk et al. |
| 2022/0039256 | A1 | 2/2022 | Adamchuk et al. |
| 2022/0186082 | A1 | 6/2022 | Adamchuk et al. |
| 2022/0195253 | A1 | 6/2022 | Adamchuk et al. |

FOREIGN PATENT DOCUMENTS

| | | |
|---|---|---|
| CN | 102719043 A | 10/2012 |
| CN | 101838431 B | 11/2012 |
| CN | 102275341 B | 11/2013 |
| CN | 104149420 A | 11/2014 |
| CN | 104476847 A | 4/2015 |
| CN | 105453705 A | 3/2016 |
| CN | 105820481 A | 8/2016 |
| CN | 106188998 A | 12/2016 |
| CN | 106604536 A | 4/2017 |
| CN | 106671517 A | 5/2017 |
| CN | 104647868 B | 9/2017 |
| CN | 107172819 A | 9/2017 |
| CN | 107177245 A | 9/2017 |
| CN | 107278031 A | 10/2017 |
| CN | 107493653 A | 12/2017 |
| CN | 107509308 A | 12/2017 |
| CN | 106009428 B | 2/2018 |
| CN | 107722518 A | 2/2018 |
| CN | 207083283 U | 3/2018 |
| CN | 106113802 B | 4/2018 |
| CN | 106313840 A | 4/2018 |
| CN | 108456387 A | 8/2018 |
| CN | 106633180 A | 10/2018 |
| CN | 107474312 B | 2/2019 |
| CN | 106800733 B | 4/2019 |
| EP | 0211979 A1 | 3/1987 |
| EP | 0279769 A2 | 8/1988 |
| EP | 0442363 A1 | 8/1991 |
| EP | 0769788 A2 | 4/1997 |
| EP | 1529812 A1 | 5/2005 |
| EP | 2179631 A2 | 4/2010 |
| EP | 2706088 A1 | 3/2014 |
| EP | 3028851 A1 | 6/2016 |
| EP | 3162561 A1 | 5/2017 |
| JP | H0349291 A | 3/1991 |
| JP | H08153940 A | 6/1996 |
| JP | 2890747 B2 | 5/1999 |
| JP | 2002151844 A | 5/2002 |
| JP | 2005001274 A | 1/2005 |
| JP | 4129627 B2 | 8/2008 |
| JP | 2009152489 A | 7/2009 |
| JP | 4598408 B2 | 12/2010 |
| JP | 4815209 B2 | 11/2011 |
| JP | 2016003260 A | 1/2016 |
| JP | 2016020488 A | 2/2016 |
| JP | 2016102563 A | 6/2016 |
| JP | 6564517 B1 | 8/2019 |
| KR | 20050090560 A | 9/2005 |
| KR | 20060027666 A | 3/2006 |
| KR | 20060127172 A | 12/2006 |
| KR | 20150006713 A | 1/2015 |
| KR | 20150113050 A | 10/2015 |
| KR | 20170134610 A | 12/2017 |
| TW | I268859 B | 12/2006 |
| TW | I590722 B | 7/2017 |
| TW | 202100354 A | 1/2021 |
| WO | 9609339 A1 | 3/1996 |
| WO | 9845880 A1 | 10/1998 |
| WO | 2006078889 A2 | 7/2006 |
| WO | 2008004399 A2 | 1/2008 |
| WO | 2015182696 A1 | 12/2015 |
| WO | 2016104297 A1 | 6/2016 |
| WO | 2016201076 A1 | 12/2016 |
| WO | 20158604 A1 | 12/2021 |
| WO | 2022026989 A1 | 2/2022 |
| WO | 2022026990 A1 | 2/2022 |
| WO | 2022026991 A1 | 2/2022 |

(56) References Cited

FOREIGN PATENT DOCUMENTS

| WO | 2022133402 A1 | 6/2022 |
| WO | 2022133403 A1 | 6/2022 |
| WO | 2022133404 A1 | 6/2022 |

OTHER PUBLICATIONS

International Search Report and Written Opinion for PCT Application No. PCT/US2021/072820, dated Mar. 31, 2022, 10 pages.
International Search Report and Written Opinion for PCT Application No. PCT/US2021/072822, dated Apr. 5, 2022, 10 pages.
International Search Report and Written Opinion for PCT Application No. PCT/US2021/070953, dated Nov. 16, 2021, 9 pages.
International Search Report and Written Opinion for PCT Application No. PCT/US2021/070954, dated Nov. 16, 2021, 9 pages.
International Search Report and Written Opinion for PCT Application No. PCT/US2021/070955, dated Nov. 16, 2021, 9 pages.
Jawitz, M.W. et al., "Chapter 6: High-Speed/High-Frequency Laminates," In Materials for Rigid and Flexible Printed Wiring Boards, First Edition. CRC Press: New York, NY, pp. 113-131, dated 2006.
Murali, K.P. et al., "Preparation and properties of silica filled PTFE flexible laminates for microwave circuit applications," Elsevier, Composites: Part A, vol. 40, pp. 1179-1185, dated 2009.
Ratheesh, R. et al., "Chapter 11: Polymer-Ceramic Composites for Microwave Applications," In Microwave Materials and Applications, First Edition. Sebastian, M. T.; Ubic, R.; Jantunen, H.; John Wiley & Sons: Chichester, UK; Hoboken, NJ, pp. 481-535, dated 2017.
Sebastian, Mailadil T. et al., "Polymer-Ceramic Composites of 0-3 Connectivity for Circuits in Electronics: A Review," International Journal of Applied Ceramic Technology, vol. 7, No. 4, pates 415-434, dated 2010.
Zhuravlev, L.T., "The Surface Chemistry of Amorphous Silica. Zhuravlev Model," Colloids and Surfaces, A: Physiochemical and Engineering Aspects, vol. 173, pp. 1-38, dated Feb. 21, 2000.
Tsai, I-Shou et al., "A Study on the Fabrication Parameters and Dielectric Properties of PTFE Composites Filled with Al2O3 and Si)2 Nanoparticles," Journal of Industrial Textiles, vol. 40, No. 4, Apr. 20, 2011, pp. 361-379.
Yuan, Y. et al., "TiO2 and SiO2 Filled PTFE Composites for Microwave Substrate Applications," Journal of Polymer Research, vol. 21, Jan. 31, 2014, 6 pages.
Han, Kunkun et al., "Effect of Filler Structure on the Dielectric and Thermal Properties of SiO2/PTFE Composites," Journal of Materials Science: Materials in Electronics, Apr. 25, 2020, 7 pages.
Yuan, Ying et al., "Effect of Sintering Temperature on the Crystallization Behavior and Properties of Silica Filled PTFE Composites," Journal of Materials Science: Materials in Electronics, vol. 27, Aug. 5, 2016, pp. 13288-13293.
Yuan, Ying et al., "Effects of Compound Coupling Agents on the Properties of PTFE/SiO2 Microwave Composites," Journal of Materials Science: Materials in Electronics, vol. 28, Oct. 25, 2016, pp. 3356-3363.
Jiang, Zehua et al., "Effects of Particle Size Distribution of Silica on Properties of PTFE/SiO2 Composites," Materials Research Express, vol. 5, Jun. 22, 2018, 10 pages.
Xiang, Pang et al., "Effects of SiO2 Content on the Properties of PTFE/SiO2 Composites," Piezoelectrics & Acoustooptics, vol. 34, No. 4, Aug. 2012, pp. 577-580.
Yong, Xiao et al., "Effects of TiO2 Content on the Properties of PTFE/TiO2 Microwave Dielectric Composites," Piezoelectrics & Acoustooptics, vol. 34, No. 5, Oct. 2012, pp. 768-771.
Fields, Jeffrey T. et al., "Fluoroalkylsilanes in Silica/Fluoropolymer Composites," Polymer Composites, vol. 17, No. 2, Apr. 1996, pp. 242-250.
Chen-Yang, Yui Whei et al., "High-Performance Circuit Boards Based on Mesoporous Silica Filled PTFE Composite Materials," Electrochemical and Solid-State Letters, vol. 8, No. 1, dated 2005, pp. F1-F4.
Yuan, Ying et al., "Influence of SiO2 Addition on Properties of PTFE/TiO2 Microwave Composites," Journal of Electronic Materials, vol. 47, No. 1, Oct. 4, 2017, pp. 633-640.
Yan, Xiangyu et al., "Influences of Sintering Process on the Properties of SiO2—TiO2/PTFE Composites," Piezoelectrics & Acoustooptics, vol. 36, No. 2, Apr. 2014, pp. 270-274.
Rajesh, S. et al., "Microwave Dielectric Properties of PTFE/Rutile Nanocomposites," Journal of Alloys and Compounds, vol. 477, dated 2009, pp. 677-682.
Zhang, Dong-na et al., "Preparation and Characterization of PTFE-g-GMA modified PTFE/SiO2 Organic-Inorganic Hybrids," Journal of Polymer Research 19:9873, Apr. 25, 2012, 10 pages.
Zhang, Yao et al., "Preparation and Mechanical Properties of SiO2/Polytetrafluoroethylene Composite Films," Acta Miateriae Compositae Sinica, vol. 36, No. 3, Mar. 2019, pp. 624-629.
Chen, Yung-Chih et al., "Preparation and properties of Silyated PTFE/SiO2 Organic-Inorganic Hybrids via Sol-Gel Process," Journal of Polymer Science: Part A: Polymer Chemistry, vol. 42, dated 2004, pp. 1789-1807.
Rajesh, S. et al., "Rutile Filled PTFE Composites for Flexible Microwave Substrate Applications," Materials Science and Engineering B, vol. 163, dated 2007, 7 pages.
Huang, Shi-Ing et al., "Study on the Composites of Two Sized Silica Filled in PTFE," Journal of Reinforced Plastics and Composites, vol. 25, No. 10, dated 2006, pp. 1053-1058.
Rajesh S. et al., "Temperature Stable Low Loss PTFE/Rutile Composites Using Secondary Polymer," Applied Physics A, Material Science & Processing, vol. 104, Nov. 4, 2010, pp. 159-164.
Chen, Yung-Chih et al., "The Effects of Filler Content and Size on the Properties of PTFE/SiO2 Composites," Journal of Polymer Research, vol. 10, dated 2003, pp. 247-258.
Chen, Yung-Chih et al., "The Effects of Phenyltrimethoxysilane Coupling Agents on the Properties of PTFE/Silica Composites," Journal of Polumer Research, vol. 11, dated 2004, pp. 1-7.
Luo, Fuchuan et al., "The Effects of TiO2 Particle Size on the Properties of PTFE/TiO2 Composites," Journal of Materials Science and Chemical Engineering, vol. 5, dated 2017, pp. 53-60.
Tsai, I-Shou et al.,"The Study of the Low K of PTFE Composites with Hollow Glass Spheres," Journal of Industrial Textiles, vol. 40, No. 3, Jan. 2011, pp. 261-280.

DIELECTRIC SUBSTRATE AND METHOD OF FORMING THE SAME

CROSS-REFERENCE TO RELATED APPLICATION(S)

This Application claims priority under 35 U.S.C. § 119(e) to U.S. Provisional Patent Application No. 63/126,105, entitled "DIELECTRIC SUBSTRATE AND METHOD OF FORMING THE SAME," by Jennifer ADAMCHUK et al., filed Dec. 16, 2020, which is assigned to the current assignee hereof and is incorporated by reference herein in its entirety.

FIELD OF THE DISCLOSURE

The present disclosure relates to a dielectric substrate and methods of forming the same. In particular, the present disclosure related to a dielectric substrate for use in a copper-clad laminate structure and a method of forming the same.

BACKGROUND

Copper-clad laminates (CCLs) include a dielectric material laminated onto or between two layers of conductive copper foil. Subsequent operations transform such CCLs into printed circuit boards (PCBs). When used to form PCBs, the conductive copper foil is selectively etched to form circuitry with through holes that are drilled between layers and metalized, i.e. plated, to establish conductivity between layers in multilayer PCBs. CCLs must therefore exhibit excellence thermomechanical stability. PCBs are also routinely exposed to excessively high temperatures during manufacturing operations, such as soldering, as well as in service. Consequently, they must function at continuous temperatures above 200° C. without deforming and withstand dramatic temperature fluctuations while resisting moisture absorption. The dielectric layer of a CCL serves as a spacer between the conductive layers and can minimize electrical signal loss and crosstalk by blocking electrical conductivity. The lower the dielectric constant (permittivity) of the dielectric layer is, the higher the speed of the electrical signal through the layer will be. A low dissipation factor, which is dependent upon temperature and frequency, as well as the polarizability of the material, is therefore very critical for high-frequency applications. Accordingly, improved dielectric materials and dielectric layers that can be used in PCBs and other high-frequency applications are desired.

SUMMARY

According to a first aspect, a dielectric substrate may include a polymer based core film, and a fluoropolymer based adhesive layer. The polymer based core film may include a resin matrix component, and a ceramic filler component. The ceramic filler component may include a first filler material. The particle size distribution of the first filler material may have a $D_{10}$ of at least about 0.5 microns and not greater than about 1.6, a $D_{50}$ of at least about 0.8 microns and not greater than about 2.7 microns, and a $D_{90}$ of at least about 1.5 microns and not greater than about 4.7 microns.

According to another aspect, a dielectric substrate may include a polymer based core film, and a fluoropolymer based adhesive layer. The polymer based core film may include a resin matrix component, and a ceramic filler component. The ceramic filler component may include a first filler material. The first filler material may further have a mean particle size of not greater than about 10 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

According to still another aspect, a dielectric substrate may include a polymer based core film, and a fluoropolymer based adhesive layer. The polymer based core film may include a resin matrix component, and a ceramic filler component. The ceramic filler component may include a first filler material. The first filler material may further have a mean particle size of not greater than about 10 microns, and an average surface area of not greater than about 8.0 m²/g.

According to another aspect, a copper-clad laminate may include a copper foil layer and a dielectric substrate overlying the copper foil layer. The dielectric substrate may include a polymer based core film, and a fluoropolymer based adhesive layer. The polymer based core film may include a resin matrix component, and a ceramic filler component. The ceramic filler component may include a first filler material that may include silica. The particle size distribution of the first filler material may have a $D_{10}$ of at least about 0.5 microns and not greater than about 1.6, a $D_{50}$ of at least about 0.8 microns and not greater than about 2.7 microns, and a $D_{90}$ of at least about 1.5 microns and not greater than about 4.7 microns.

According to yet another aspect, a copper-clad laminate may include a copper foil layer and a dielectric substrate overlying the copper foil layer. The dielectric substrate may include a polymer based core film, and a fluoropolymer based adhesive layer. The polymer based core film may include a resin matrix component, and a ceramic filler component. The ceramic filler component may include a first filler material. The first filler material may further have a mean particle size of not greater than about 10 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

According to still another aspect, a copper-clad laminate may include a copper foil layer and a dielectric substrate overlying the copper foil layer. The dielectric substrate may include a polymer based core film, and a fluoropolymer based adhesive layer. The polymer based core film may include a resin matrix component, and a ceramic filler component. The ceramic filler component may include a first filler material. The first filler material may further have a mean particle size of not greater than about 10 microns, and an average surface area of not greater than about 8.0 m²/g.

According to another aspect, a method of forming a dielectric substrate may include combining a resin matrix precursor component and a ceramic filler precursor component to form a forming mixture, forming the forming mixture into a polymer based core film, and coating the polymer based core film with a fluoropolymer based adhesive layer. The ceramic filler precursor component may include a first filler precursor material. The particle size distribution of the first filler material may have a $D_{10}$ of at least about 0.5 microns and not greater than about 1.6, a $D_{50}$ of at least about 0.8 microns and not greater than about 2.7 microns, and a $D_{90}$ of at least about 1.5 microns and not greater than about 4.7 microns.

According to another aspect, a method of forming a dielectric substrate may include combining a resin matrix precursor component and a ceramic filler precursor component to form a forming mixture; and forming the forming mixture into a polymer based core film, and coating the polymer based core film with a fluoropolymer based adhesive layer. The ceramic filler precursor component may include a first filler precursor material. The first filler precursor material may further have a mean particle size of not greater than about 10 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

According to still another aspect, a method of forming a dielectric substrate may include combining a resin matrix precursor component and a ceramic filler precursor component to form a forming mixture; forming the forming mixture into a polymer based core film, and coating the polymer based core film with a fluoropolymer based adhesive layer. The ceramic filler precursor component may include a first filler precursor material. The first filler material may further have a mean particle size of not greater than about 10 microns, and an average surface area of not greater than about 8.0 m²/g.

According to another aspect, a method of forming a copper-clad laminate may include providing a copper foil layer, combining a resin matrix precursor component and a ceramic filler precursor component to form a forming mixture, forming the forming mixture into a polymer based core film, and providing a fluoropolymer based adhesive layer between the polymer based core film and the copper foil. The ceramic filler precursor component may include a first filler precursor material. The particle size distribution of the first filler material may have a $D_{10}$ of at least about 0.5 microns and not greater than about 1.6, a $D_{50}$ of at least about 0.8 microns and not greater than about 2.7 microns, and a $D_{90}$ of at least about 1.5 microns and not greater than about 4.7 microns.

According to yet another aspect, a method of forming a copper-clad laminate may include providing a copper foil layer, combining a resin matrix precursor component and a ceramic filler precursor component to form a forming mixture, forming the forming mixture into a polymer based core film, and providing a fluoropolymer based adhesive layer between the polymer based core film and the copper foil. The ceramic filler precursor component may include a first filler precursor material. The first filler precursor material may further have a mean particle size of not greater than about 10 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

According to still another aspect, a method of forming a copper-clad laminate may include providing a copper foil layer, combining a resin matrix precursor component and a ceramic filler precursor component to form a forming mixture, forming the forming mixture into a polymer based core film, and providing a fluoropolymer based adhesive layer between the polymer based core film and the copper foil. The ceramic filler precursor component may include a first filler precursor material. The first filler material may further have a mean particle size of not greater than about 10 microns, and an average surface area of not greater than about 8.0 m²/g.

BRIEF DESCRIPTION OF THE DRAWINGS

Embodiments are illustrated by way of example and are not limited to the accompanying figures.

Skilled artisans appreciate that elements in the figures are illustrated for simplicity and clarity and have not necessarily been drawn to scale.

DETAILED DESCRIPTION

The following discussion will focus on specific implementations and embodiments of the teachings. The detailed description is provided to assist in describing certain embodiments and should not be interpreted as a limitation on the scope or applicability of the disclosure or teachings. It will be appreciated that other embodiments can be used based on the disclosure and teachings as provided herein.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Embodiments described herein are generally directed to a dielectric substrate that may include a polymer based core film, and a fluoropolymer based adhesive layer. According to particular embodiments, the polymer based core film may include a resin matrix component, and a ceramic filler component.

Figure 1:
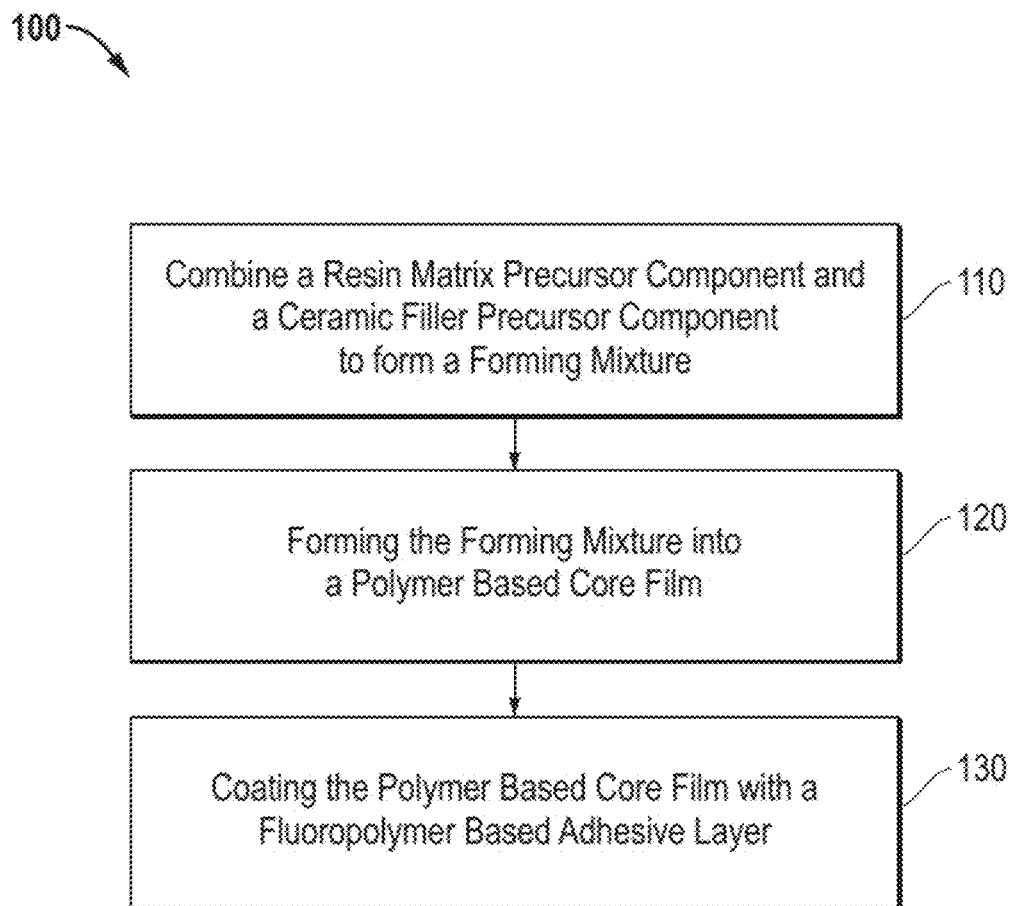
FIG. 1 includes a diagram showing a dielectric layer forming method according to embodiments described herein.

Referring first to a method of forming a dielectric substrate, FIG. 1 includes a diagram showing a forming method 100 for forming a dielectric substrate according to embodiments described herein. According to particular embodiments, the forming method 100 may include a first step 110 of combining a resin matrix precursor component and a ceramic filler precursor component to form a forming mixture, a second step 120 of forming the forming mixture into a polymer based core film, and a third step 130 of coating the polymer based core film with a fluoropolymer based adhesive layer.

According to particular embodiments, the ceramic filler precursor component may include a first filler precursor material, which may have particular characteristics that may improve performance of the dielectric substrate formed by the forming method 100.

According to certain embodiments, the first filler precursor material may have a particular size distribution. For purposes of embodiments described herein, the particle size distribution of a material, for example, the particle size distribution of a first filler precursor material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the first filler precursor material may have a particular size distribution $D_{10}$ value. For example, the $D_{10}$ of the first filler precursor material may be at least about 0.5 microns, such as, at least about 0.6 microns or at least about 0.7 microns or at least about 0.8 microns or at least about 0.9 microns or at least about 1.0 microns or at least about 1.1 microns or even at least about 1.2 microns. According to still other embodiments, the $D_{10}$ of the first filler material may be not greater than about 1.6 microns, such as, not greater than about 1.5 microns or even not greater than about 1.4 microns. It will be appreciated that the $D_{10}$ of the first filler precursor material may be any value between, and including, any of the minimum and maximum values noted above. It will be further appreciated that the $D_{10}$ of the first filler precursor material may be within a range between, and including, any of the minimum and maximum values noted above.

According to other embodiments, the first filler precursor material may have a particular size distribution $D_{50}$ value. For example, the $D_{50}$ of the first filler precursor material may be at least about 0.8 microns, such as, at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the first filler material may be not greater than about 2.7 microns, such as, not greater than about 2.6 microns or not greater than about 2.5 microns or even not greater than about 2.4. It will be appreciated that the $D_{50}$ of the first filler precursor material may be any value between, and including, any of the minimum and maximum values noted above. It will be further appreciated that the $D_{50}$ of the first filler precursor material may be within a range between, and including, any of the minimum and maximum values noted above.

According to other embodiments, the first filler precursor material may have a particular size distribution $D_{90}$ value. For example, the $D_{90}$ of the first filler precursor material may be at least about 1.5 microns, such as, at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.4 microns or at least about 2.5 microns or at least about 2.6 microns or even at least about 2.7 microns. According to still other embodiments, the $D_{90}$ of the first filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the first filler precursor material may be any value between, and including, any of the minimum and maximum values noted above. It will be further appreciated that the $D_{90}$ of the first filler precursor material may be within a range between, and including, any of the minimum and maximum values noted above.

According to still other embodiments, the first filler precursor material may have a particular mean particle size as measured using laser diffraction spectroscopy. For example, the mean particle size of the first filler precursor material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 3 microns. It will be appreciated that the mean particle size of the first filler precursor material may be any value between, and including, any of the values noted above. It will be further appreciated that the mean particle size of the first filler precursor material may be within a range between, and including, any of the values noted above.

According to still other embodiments, the first filler precursor material may be described as having a particular particle size distribution span (PSDS), where the PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material. For example, the PSDS of the first filler precursor material may be not greater than about 5, such as, not greater than about 4.5 or not greater than about 4.0 or not greater than about 3.5 or not greater than about 3.0 or even not greater than about 2.5. It will be appreciated that the PSDS of the first filler precursor material may be any value between, and including, any of the values noted above. It will be further appreciated that the PSDS of the first filler precursor material may be within a range between, and including, any of the values noted above.

According to still other embodiments, the first filler precursor material may be described as having a particular average surface area as measured using Brunauer-Emmett-Teller (BET) surface area analysis (Nitrogen Adsorption). For example, the first filler precursor material may have an average surface area of not greater than about 8 m$^2$/g, such as, not greater than about 7.9 m$^2$/g or not greater than about 7.5 m$^2$/g or not greater than about 7.0 m$^2$/g or not greater than about 6.5 m$^2$/g or not greater than about 6.0 m$^2$/g or not greater than about 5.5 m$^2$/g or not greater than about 5.0 m$^2$/g or not greater than about 4.5 m$^2$/g or not greater than about 4.0 m$^2$/g or even not greater than about 3.5 m$^2$/g. According to still other embodiments, the first filler precursor material may have an average surface area of at least about 1.2 m$^2$/g, such as, at least about 2.2 m$^2$/g. It will be appreciated that the average surface area of the first filler precursor material may be any value between, and including, any of the minimum and maximum values noted above. It will be further appreciated that the average surface area of the first filler precursor material may be within a range between, and including, any of the minimum and maximum values noted above.

According to other embodiments, the first filler precursor material may include a particular material. According to particular embodiments, the first filler precursor material may include a silica based compound. According to still other embodiments, the first filler precursor material may consist of a silica based compound. According to other embodiments, the first filler precursor material may include silica. According to still other embodiments, the first filler precursor material may consist of silica.

According to yet other embodiments, the forming mixture may include a particular content of the ceramic filler precursor component. For example, the content of the ceramic filler precursor component may be at least about 45 vol. % for a total volume of the forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the ceramic filler precursor component may be not greater than about 57 vol. % for a total volume of the forming mixture, such as, not greater than about 56 vol. % or even not greater than about 55 vol. %. It will be appreciated that the content of the ceramic filler precursor component may be any value between, and including, any of the minimum and maximum values noted above. It will be further appreciated that the content of the ceramic filler precursor component may be within a range between, and including, any of the minimum and maximum values noted above.

According to still other embodiments, the ceramic filler precursor component may include a particular content of the first filler precursor material. For example, the content of the first filler precursor material may be at least about 80 vol. % for a total volume of the ceramic filler precursor component, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the first filler precursor material may be not greater than about 100 vol. % for a total volume of the ceramic filler precursor component, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the first filler precursor material may be any value between, and including, any of the minimum and maximum values noted above. It will be further appreciated that the content of the first filler precursor material may be within a range between, and including, any of the minimum and maximum values noted above.

According to still other embodiments, the ceramic filler precursor component may include a second filler precursor material.

According to yet other embodiments, the second filler precursor material may include a particular material. For example, the second filler precursor material may include a high dielectric constant ceramic material, such as, a ceramic material having a dielectric constant of at least about 14. According to particular embodiments, the second filler precursor material may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the second filler precursor material may include $TiO_2$. According to still other embodiments, the second filler precursor material may consist of $TiO_2$.

According to still other embodiments, the ceramic filler precursor component may include a particular content of the second filler precursor material. For example, the content of the second filler precursor material may be at least about 1 vol. % for a total volume of the ceramic filler precursor component, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the second filler precursor material may be not greater than about 20 vol. % for a total volume of the ceramic filler precursor component, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the second filler precursor material may be any value between, and including, any of the minimum and maximum values noted above. It will be further appreciated that the content of the second filler precursor material may be within a range between, and including, any of the minimum and maximum values noted above.

According to yet other embodiments, the ceramic filler precursor component may include a particular content of amorphous material. For example, the ceramic filler precursor component may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above. According to other embodiments, the resin matrix precursor component may include a particular material. For example, the resin matrix precursor component may include a perfluoropolymer. According to still other embodiments, the resin matrix precursor component may consist of a perfluoropolymer.

According to yet other embodiments, the perfluoropolymer of the resin matrix precursor component may include a copolymer of tetrafluoroethylene (TFE); a copolymer of hexafluoropropylene (HFP); a terpolymer of tetrafluoroethylene (TFE); or any combination thereof. According to other embodiments, the perfluoropolymer of the resin matrix precursor component may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the resin matrix precursor component may include polytetrafluoroethylene (PTFE), perfluoroalkoxy polymer resin (PFA), fluorinated ethylene propylene (FEP), or any combination thereof. According to still other embodiments, the perfluoropolymer of the resin matrix precursor component may consist of polytetrafluoroethylene (PTFE), perfluoroalkoxy polymer resin (PFA), fluorinated ethylene propylene (FEP), or any combination thereof.

According to yet other embodiments, the forming mixture may include a particular content of the resin matrix precursor component. For example, the content of the resin matrix precursor component may be at least about 45 vol. % for a total volume of the forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the resin matrix precursor component is not greater than about 63 vol. % for a total volume of the forming mixture or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the resin matrix precursor component may be any value between, and including, any of the minimum and maximum values noted above. It will be further appreciated that the content of the resin matrix precursor component may be within a range between, and including, any of the minimum and maximum values noted above.

According to yet other embodiments, the forming mixture may include a particular content of the perfluoropolymer. For example, the content of the perfluoropolymer may be at least about 45 vol. % for a total volume of the forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the forming mixture, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

Figure 2:
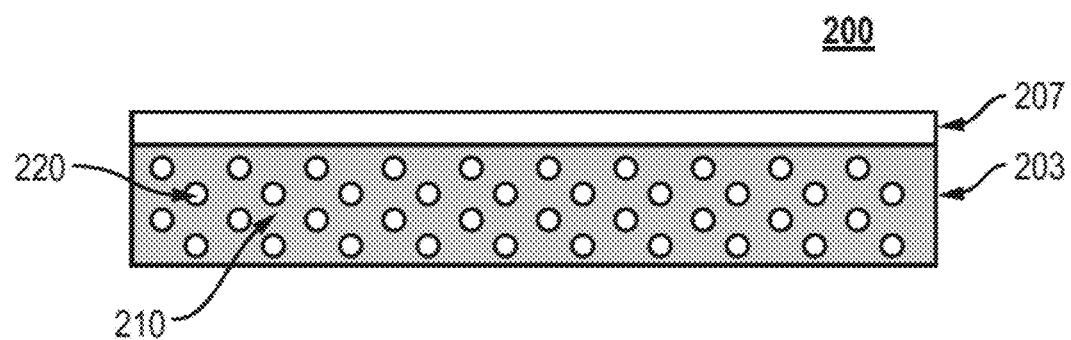
FIG. 2 includes an illustration showing the configuration of a dielectric layer formed according to embodiments described herein.

Referring now to embodiments of the dielectric substrate formed according to forming method 100, FIG. 2 includes diagram of a dielectric substrate 200. As shown in FIG. 2, the dielectric substrate 200 may include a polymer based core film 203, and a fluoropolymer based adhesive layer 207. As further shown in FIG. 2, the polymer based core film 203 may include a resin matrix component 210 and a ceramic filler component 220.

According to particular embodiments, the ceramic filler component 220 may include a first filler material, which may have particular characteristics that may improve performance of the dielectric substrate 200.

According to certain embodiments, the first filler material of the ceramic filler component 220 may have a particular size distribution. For purposes of embodiments described herein, the particle size distribution of a material, for example, the particle size distribution of a first filler material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the first filler material of the ceramic filler component 220 may have a particular size distribution $D_{10}$ value. For example, the $D_{10}$ of the first filler material may be at least about 0.5 microns, such as, at least about 0.6 microns or at least about 0.7 microns or at least about 0.8 microns or at least about 0.9 microns or at least about 1.0 microns or at least about 1.1 microns or even at least about 1.2 microns. According to still other embodiments, the $D_{10}$ of the first filler material may be not greater than about 1.6 microns, such as, not greater than about 1.5 microns or even not greater than about 1.4 microns. It will be appreciated that the $D_{10}$ of the first filler material may be any value between, and including, any of the minimum and maximum values noted above. It will be further appreciated that the $D_{10}$ of the first filler material may be within a range between, and including, any of the minimum and maximum values noted above.

According to other embodiments, the first filler material of the ceramic filler component 220 may have a particular size distribution $D_{50}$ value. For example, the $D_{50}$ of the first filler material may be at least about 0.8 microns, such as, at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the first filler material may be not greater than about 2.7 microns, such as, not greater than about 2.6 microns or not greater than about 2.5 microns or even not greater than about 2.4. It will be appreciated that the $D_{50}$ of the first filler material may be any value between, and including, any of the minimum and maximum values noted above. It will be further appreciated that the $D_{50}$ of the first filler material may be within a range between, and including, any of the minimum and maximum values noted above.

According to other embodiments, the first filler material of the ceramic filler component 220 may have a particular size distribution $D_{90}$ value. For example, the $D_{90}$ of the first filler material may be at least about 1.5 microns, such as, at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.4 microns or at least about 2.5 microns or at least about 2.6 microns or even at least about 2.7 microns. According to still other embodiments, the $D_{90}$ of the first filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the first filler material may be any value between, and including, any of the minimum and maximum values noted above. It will be further appreciated that the $D_{90}$ of the first filler material may be within a range between, and including, any of the minimum and maximum values noted above.

According to still other embodiments, the first filler material of the ceramic filler component 220 may have a particular mean particle size as measured according to laser diffraction spectroscopy. For example, the mean particle size of the first filler material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the first filler material may be any value between, and including, any of the values noted above. It will be further appreciated that the mean particle size of the first filler material may be within a range between, and including, any of the values noted above.

According to still other embodiments, the first filler material of the ceramic filler component 220 may be described as having a particular particle size distribution span (PSDS), where the PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material. For example, the PSDS of the first filler material may be not greater than about 5, such as, not greater than about 4.5 or not greater than about 4.0 or not greater than about 3.5 or not greater than about 3.0 or even not greater than about 2.5. It will be appreciated that the PSDS of the first filler material may be any value between, and including, any of the values noted above. It will be further appreciated that the PSDS of the first filler material may be within a range between, and including, any of the values noted above.

According to still other embodiments, the first filler material of the ceramic filler component 220 may be described as having a particular average surface area as measured using Brunauer-Emmett-Teller (BET) surface area analysis (Nitrogen Adsorption). For example, the first filler material may have an average surface area of not greater than about 8 $m^2/g$, such as, not greater than about 7.9 $m^2/g$ or not greater than about 7.5 $m^2/g$ or not greater than about 7.0 $m^2/g$ or not greater than about 6.5 $m^2/g$ or not greater than about 6.0 $m^2/g$ or not greater than about 5.5 $m^2/g$ or not greater than about 5.0 $m^2/g$ or not greater than about 4.5 $m^2/g$ or not greater than about 4.0 $m^2/g$ or even not greater than about 3.5 $m^2/g$. According to still other embodiments, the first filler material may have an average surface area of at least about 1.2 $m^2/g$, such as, at least about 2.2 $m^2/g$. It will be appreciated that the average surface area of the first filler material may be any value between, and including, any of the minimum and maximum values noted above. It will be further appreciated that the average surface area of the first filler material may be within a range between, and including, any of the minimum and maximum values noted above.

According to still other embodiments, the fluoropolymer based adhesive layer 207 may have a particular average thickness. For example, the average thickness of the adhesive layer 207 may be at least about 0.2 microns, such as, at least about 0.5 microns or at least about 1.0 microns or at least about 1.5 microns or at least about 2.0 microns or at least about 2.5 microns or even at least about 3.0 microns. According to yet other embodiments, the average thickness of the adhesive layer 207 may be not greater than about 7 microns, such as, not greater than about 6.5 or not greater than about 6.0 or not greater than about 5.5 or not greater than about 5.0 not greater than about 4.9 microns or not greater than about 4.8 microns or not greater than about 4.7 microns or not greater than about 4.6 microns or not greater than about 4.5 microns or not greater than about 4.4 microns or not greater than about 4.3 microns or not greater than about 4.2 microns or not greater than about 4.1 microns or not greater than about 4.1 microns or not greater than about 4.0 microns or not greater than about 3.9 microns or not greater than about 3.8 microns or not greater than about 3.7 microns or not greater than about 3.6 microns or even not greater than about 3.5 microns. It will be appreciated that the average thickness of the adhesive layer 207 may be any value between, and including, any of the minimum and maximum values noted above. It will be further appreciated that the average thickness of the adhesive layer 207 may be within a range between, and including, any of the minimum and maximum values noted above.

According to still other embodiments, the fluoropolymer based adhesive layer 207 may include a particular material. For example, the fluoropolymer based adhesive layer 207 may include, but is not limited to, fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

According to other embodiments, the first filler material of the ceramic filler component 220 may include a particular material. According to particular embodiments, the first filler material may include a silica based compound. According to still other embodiments, the first filler material may consist of a silica based compound. According to other embodiments, the first filler material may include silica. According to still other embodiments, the first filler material may consist of silica.

According to yet other embodiments, the polymer based core film 203 may include a particular content of the ceramic filler component 220. For example, the content of the ceramic filler component 220 may be at least about 45 vol. % for a total volume of the polymer based core film 203, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the ceramic filler component 220 may be not greater than about 57 vol. % for a total volume of the polymer based core film 203, such as, not greater than about 56 vol. % or even not greater than about 55 vol. %. It will be appreciated that the content of the ceramic filler component 220 may be any value between, and including, any of the minimum and maximum values noted above. It will be further appreciated that the content of the ceramic filler component 220 may be within a range between, and including, any of the minimum and maximum values noted above.

According to yet other embodiments, the dielectric substrate 200 may include a particular content of the ceramic filler component 220. For example, the content of the ceramic filler component 220 may be at least about 45 vol. % for a total volume of the dielectric substrate 200, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the ceramic filler component 220 may be not greater than about 57 vol. % for a total volume of the dielectric substrate 200, such as, not greater than about 56 vol. % or even not greater than about 55 vol. %. It will be appreciated that the content of the ceramic filler component 220 may be any value between, and including, any of the minimum and maximum values noted above. It will be further appreciated that the content of the ceramic filler component 220 may be within a range between, and including, any of the minimum and maximum values noted above.

According to still other embodiments, the ceramic filler component 220 may include a particular content of the first filler material. For example, the content of the first filler material may be at least about 80 vol. % for a total volume of the ceramic filler component 220, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the first filler material may be not greater than about 100 vol. % for a total volume of the ceramic filler component 220, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the first filler material may be any value between, and including, any of the minimum and maximum values noted above. It will be further appreciated that the content of the first filler material may be within a range between, and including, any of the minimum and maximum values noted above.

According to still other embodiments, the ceramic filler component 220 may include a second filler material.

According to yet other embodiments, the second filler material of the ceramic filler component 220 may include a particular material. For example, the second filler material may include a high dielectric constant ceramic material, such as, a ceramic material having a dielectric constant of at least about 14. According to particular embodiments, the second filler material of the ceramic filler component 220 may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the second filler material of the ceramic filler component 220 may include $TiO_2$. According to still other embodiments, the second filler material may consist of $TiO_2$.

According to still other embodiments, the ceramic filler component 220 may include a particular content of the second filler material. For example, the content of the second filler material may be at least about 1 vol. % for a total volume of the ceramic filler component 220, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the second filler material may be not greater than about 20 vol. % for a total volume of the ceramic filler component 220, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the second filler material may be any value between, and including, any of the minimum and maximum values noted above. It will be further appreciated that the content of the second filler material may be within a range between, and including, any of the minimum and maximum values noted above.

According to yet other embodiments, the ceramic filler component 220 may include a particular content of amorphous material. For example, the ceramic filler component 220 may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

According to other embodiments, the resin matrix component 210 may include a particular material. For example, the resin matrix component 210 may include a perfluoropolymer. According to still other embodiments, the resin matrix component 210 may consist of a perfluoropolymer.

According to yet other embodiments, the perfluoropolymer of the resin matrix component 210 may include a copolymer of tetrafluoroethylene (TFE); a copolymer of hexafluoropropylene (HFP); a terpolymer of tetrafluoroethylene (TFE); or any combination thereof. According to other embodiments, the perfluoropolymer of the resin matrix component 210 may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the resin matrix component 210 may include polytetrafluoroethylene (PTFE), perfluoroalkoxy polymer resin (PFA), fluorinated ethylene propylene (FEP), or any combination thereof. According to still other embodiments, the perfluoropolymer of the resin matrix component 210 may consist of polytetrafluoroethylene (PTFE), perfluoroalkoxy polymer resin (PFA), fluorinated ethylene propylene (FEP), or any combination thereof.

According to yet other embodiments, the polymer based core film 203 may include a particular content of the resin matrix component 210. For example, the content of the resin matrix component 210 may be at least about 45 vol. % for a total volume of the polymer based core film 203, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the resin matrix component 210 is not greater than about 63 vol. % for a total volume of the polymer based core film 203 or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the resin matrix component 210 may be any value between, and including, any of the minimum and maximum values noted above. It will be further appreciated that the content of the resin matrix component 210 may be within a range between, and including, any of the minimum and maximum values noted above.

According to yet other embodiments, the dielectric substrate 200 may include a particular content of the resin matrix component 210. For example, the content of the resin matrix component 210 may be at least about 45 vol. % for a total volume of the dielectric substrate 200, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the resin matrix component 210 is not greater than about 63 vol. % for a total volume of the dielectric substrate 200 or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the resin matrix component 210 may be any value between, and including, any of the minimum and maximum values noted above. It will be further appreciated that the content of the resin matrix component 210 may be within a range between, and including, any of the minimum and maximum values noted above.

According to yet other embodiments, the polymer based core film 203 may include a particular content of the perfluoropolymer. For example, the content of the perfluoropolymer may be at least about 45 vol. % for a total volume of the polymer based core film 203, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the polymer based core film 203, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

According to yet other embodiments, the dielectric substrate 200 may include a particular content of the perfluoropolymer. For example, the content of the perfluoropolymer may be at least about 45 vol. % for a total volume of the dielectric substrate 200, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the dielectric substrate 200, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

According to still other embodiments, the polymer based core film 203 may include a particular porosity as measured using x-ray diffraction. For example, the porosity of the polymer based core film 203 may be not greater than about 10 vol. %, such as, not greater than about 9 vol. % or not greater than about 8 vol. % or not greater than about 7 vol. % or not greater than about 6 vol. % or even not greater than about 5 vol. %. It will be appreciated that the porosity of the dielectric polymer based core film 203 may be any value between, and including, any of the values noted above. It will be further appreciated that the porosity of the polymer based core film 203 may be within a range between, and including, any of the values noted above.

According to yet other embodiments, the polymer based core film 203 may have a particular average thickness. For example, the average thickness of the polymer based core film 203 may be at least about 10 microns, such as, at least about 15 microns or at least about 20 microns or at least about 25 microns or at least about 30 microns or at least about 35 microns or at least about 40 microns or at least about 45 microns or at least about 50 microns or at least about 55 microns or at least about 60 microns or at least about 65 microns or at least about 70 microns or even at least about 75 microns. According to yet other embodiments, the average thickness of the polymer based core film 203 may be not greater than about 2000 microns, such as, not greater than about 1800 microns or not greater than about 1600 microns or not greater than about 1400 microns or not greater than about 1200 microns or not greater than about 1000 microns or not greater than about 800 microns or not greater than about 600 microns or not greater than about 400 microns or not greater than about 200 microns or not greater than about 190 microns or not greater than about 180 microns or not greater than about 170 microns or not greater than about 160 microns or not greater than about 150 microns or not greater than about 140 microns or not greater than about 120 microns or even not greater than about 100 microns. It will be appreciated that the average thickness of the polymer based core film 203 may be any value between, and including, any of the minimum and maximum values noted above. It will be further appreciated that the average thickness of the polymer based core film 203 may be within a range between, and including, any of the minimum and maximum values noted above.

According to yet other embodiments, the polymer based core film 203 may have a particular dissipation factor (Df) as measured in the range between 5 GHz, 20% RH. For example, the polymer based core film 203 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 203 may be any value between, and including, any of the values noted above. It will be further appreciated that the dissipation factor of the polymer based core film 203 may be within a range between, and including, any of the values noted above.

According to yet other embodiments, the polymer based core film 203 may have a particular dissipation factor (Df) as measured in the range between 5 GHz, 80% RH. For example, the polymer based core film 203 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 203 may be any value between, and including, any of the values noted above. It will be further appreciated that the dissipation factor of the polymer based core film 203 may be within a range between, and including, any of the values noted above.

According to yet other embodiments, the polymer based core film 203 may have a particular dissipation factor (Df) as measured in the range between 10 GHz, 20% RH. For example, the polymer based core film 203 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 203 may be any value between, and including, any of the values noted above. It will be further appreciated that the dissipation factor of the polymer based core film 203 may be within a range between, and including, any of the values noted above.

According to yet other embodiments, the polymer based core film 203 may have a particular dissipation factor (Df) as measured in the range between 10 GHz, 80% RH. For example, the polymer based core film 203 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 203 may be any value between, and including, any of the values noted above. It will be further appreciated that the dissipation factor of the polymer based core film 203 may be within a range between, and including, any of the values noted above.

According to yet other embodiments, the polymer based core film 203 may have a particular dissipation factor (Df) as measured in the range between 28 GHz, 20% RH. For example, the polymer based core film 203 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 203 may be any value between, and including, any of the values noted above. It will be further appreciated that the dissipation factor of the polymer based core film 203 may be within a range between, and including, any of the values noted above.

According to yet other embodiments, the polymer based core film 203 may have a particular dissipation factor (Df) as measured in the range between 28 GHz, 80% RH. For example, the polymer based core film 203 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 203 may be any value between, and including, any of the values noted above. It will be further appreciated that the dissipation factor of the polymer based core film 203 may be within a range between, and including, any of the values noted above.

According to yet other embodiments, the polymer based core film 203 may have a particular dissipation factor (Df) as measured in the range between 39 GHz, 20% RH. For example, the polymer based core film 203 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 203 may be any value between, and including, any of the values noted above. It will be further appreciated that the dissipation factor of the polymer based core film 203 may be within a range between, and including, any of the values noted above.

According to yet other embodiments, the polymer based core film 203 may have a particular dissipation factor (Df) as measured in the range between 39 GHz, 80% RH. For example, the polymer based core film 203 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 203 may be any value between, and including, any of the values noted above. It will be further appreciated that the dissipation factor of the polymer based core film 203 may be within a range between, and including, any of the values noted above.

According to yet other embodiments, the polymer based core film 203 may have a particular dissipation factor (Df) as measured in the range between 76-81 GHz, 20% RH. For example, the polymer based core film 203 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 203 may be any value between, and including, any of the values noted above. It will be further appreciated that the dissipation factor of the polymer based core film 203 may be within a range between, and including, any of the values noted above.

According to yet other embodiments, the polymer based core film 203 may have a particular dissipation factor (Df) as measured in the range between 76-81 GHz, 80% RH. For example, the polymer based core film 203 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 203 may be any value between, and including, any of the values noted above. It will be further appreciated that the dissipation factor of the polymer based core film 203 may be within a range between, and including, any of the values noted above.

According to yet other embodiments, the polymer based core film 203 may have a particular coefficient of thermal expansion as measured according to IPC-TM-650 2.4.24 Rev. C Glass Transition Temperature and Z-Axis Thermal Expansion by TMA. For example, the polymer based core film 203 may have a coefficient of thermal expansion of not greater than about 80 ppm/° C.

It will be appreciated that any dielectric substrate described herein (e.g. polymer based core film 203) may include additional polymer based layers on the outer surfaces of the originally described dielectric substrate and that the additional polymer based layers may include filler (i.e. be filled polymer layers) as described herein or may not include fillers (i.e. be unfilled polymer layers).

According to yet other embodiments, the dielectric substrate 200 may have a particular average thickness. For example, the average thickness of the dielectric substrate 200 may be at least about 10 microns, such as, at least about 15 microns or at least about 20 microns or at least about 25 microns or at least about 30 microns or at least about 35 microns or at least about 40 microns or at least about 45 microns or at least about 50 microns or at least about 55 microns or at least about 60 microns or at least about 65 microns or at least about 70 microns or even at least about 75 microns. According to yet other embodiments, the average thickness of the dielectric substrate 200 may be not greater than about 2000 microns, such as, not greater than about 1800 microns or not greater than about 1600 microns or not greater than about 1400 microns or not greater than about 1200 microns or not greater than about 1000 microns or not greater than about 800 microns or not greater than about 600 microns or not greater than about 400 microns or not greater than about 200 microns or not greater than about 190 microns or not greater than about 180 microns or not greater than about 170 microns or not greater than about 160 microns or not greater than about 150 microns or not greater than about 140 microns or not greater than about 120 microns or even not greater than about 100 microns. It will be appreciated that the average thickness of the dielectric substrate 200 may be any value between, and including, any of the minimum and maximum values noted above. It will be further appreciated that the average thickness of the dielectric substrate 200 may be within a range between, and including, any of the minimum and maximum values noted above.

According to yet other embodiments, the dielectric substrate 200 may have a particular dissipation factor (Df) as measured in the range between 5 GHz, 20% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 5 GHz, 80% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 10 GHz, 20% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 10 GHz, 80% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 28 GHz, 20% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 28 GHz, 80% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 39 GHz, 20% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 39 GHz, 80% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 76-81 GHz, 20% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular dissipation factor (Df) as measured in the range between 76-81 GHz, 80% RH. For example, the dielectric substrate 200 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 200 may be any value between, and including, any of the values noted above. It will be further appreciated that the dissipation factor of the dielectric substrate 200 may be within a range between, and including, any of the values noted above.

According to yet other embodiments, the dielectric substrate 200 may have a particular coefficient of thermal expansion as measured according to IPC-TM-650 2.4.24 Rev. C Glass Transition Temperature and Z-Axis Thermal Expansion by TMA. For example, the dielectric substrate 200 may have a coefficient of thermal expansion of not greater than about 80 ppm/° C.

It will be appreciated that any dielectric substrate described herein (e.g. dielectric substrate 200) may include additional polymer based layers on the outer surfaces of the originally described dielectric substrate and that the additional polymer based layers may include filler (i.e. be filled polymer layers) as described herein or may not include fillers (i.e. be unfilled polymer layers).

Turning now to embodiments of copper-clad laminates that may include dielectric substrates described herein. Such additional embodiments described herein are generally directed to a copper-clad laminate that may include a copper foil layer and a dielectric substrate overlying the copper foil layer. According to certain embodiments, the dielectric substrate may include a polymer based core film, and a fluoropolymer based adhesive layer. According to particular embodiments, the polymer based core film may include a resin matrix component, and a ceramic filler component.

Figure 3:
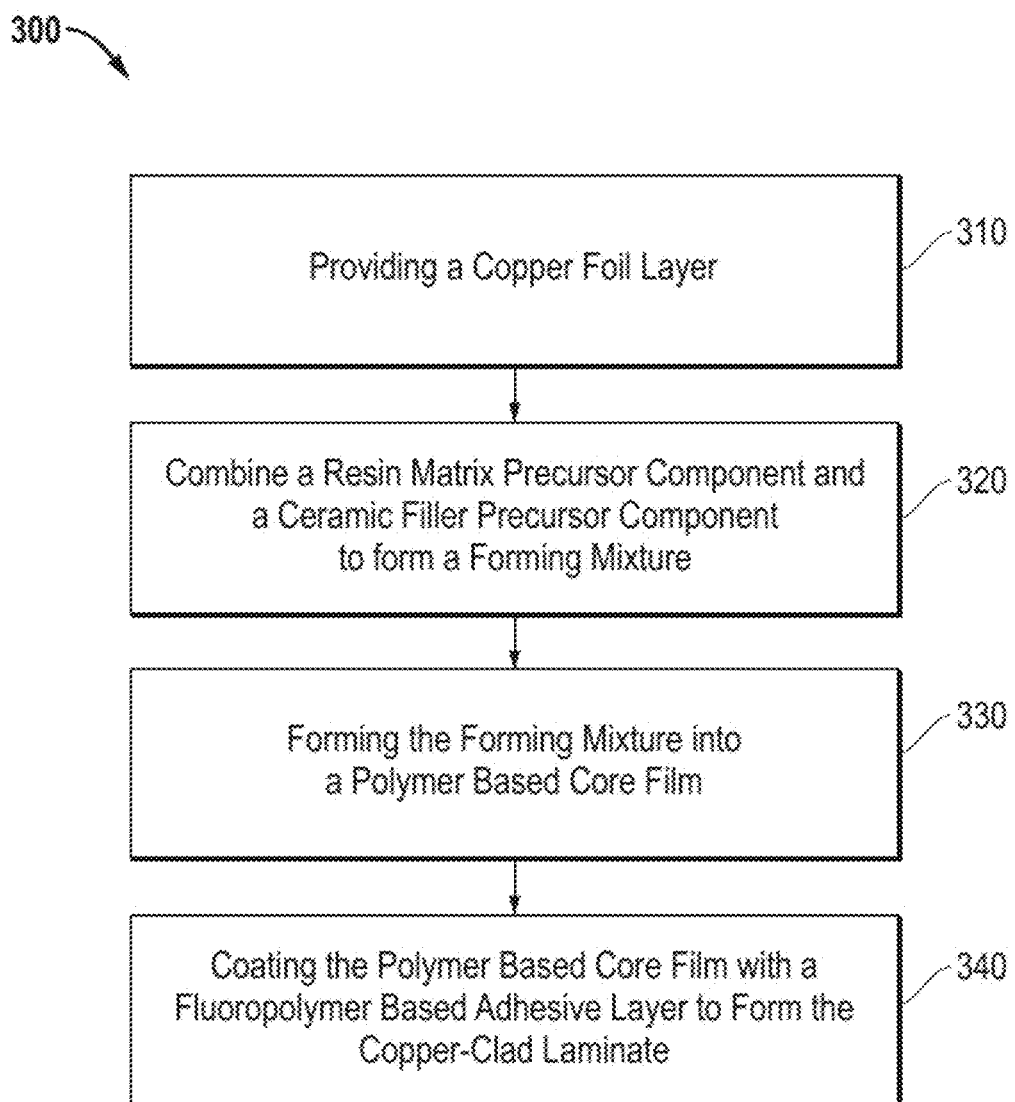
FIG. 3 includes a diagram showing a copper-clad laminate forming method according to embodiments described herein.

Referring next to a method of forming a copper-clad laminate, FIG. 3 includes a diagram showing a forming method 300 for forming a copper-clad laminate according to embodiments described herein. According to particular embodiments, the forming method 300 may include a first step 310 of providing a copper foil layer, a second step 320 of combining a resin matrix precursor component and a ceramic filler precursor component to form a forming mixture, a third step 330 of forming the forming mixture into a polymer based core film, and a fourth step 340 of coating the polymer based core film with a fluoropolymer based adhesive layer to form the copper-clad laminate.

According to particular embodiments, the ceramic filler precursor component may include a first filler precursor material, which may have particular characteristics that may improve performance of the dielectric substrate formed by the forming method 300.

According to certain embodiments, the first filler precursor material may have a particular size distribution. For purposes of embodiments described herein, the particle size distribution of a material, for example, the particle size distribution of a first filler precursor material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the first filler precursor material may have a particular size distribution $D_{10}$ value. For example, the $D_{10}$ of the first filler precursor material may be at least about 0.5 microns, such as, at least about 0.6 microns or at least about 0.7 microns or at least about 0.8 microns or at least about 0.9 microns or at least about 1.0 microns or at least about 1.1 microns or even at least about 1.2 microns. According to still other embodiments, the $D_{10}$ of the first filler material may be not greater than about 1.6 microns, such as, not greater than about 1.5 microns or even not greater than about 1.4 microns. It will be appreciated that the $D_{10}$ of the first filler precursor material may be any value between, and including, any of the minimum and maximum values noted above. It will be further appreciated that the $D_{10}$ of the first filler precursor material may be within a range between, and including, any of the minimum and maximum values noted above.

According to other embodiments, the first filler precursor material may have a particular size distribution $D_{50}$ value. For example, the $D_{50}$ of the first filler precursor material may be at least about 0.8 microns, such as, at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the first filler material may be not greater than about 2.7 microns, such as, not greater than about 2.6 microns or not greater than about 2.5 microns or even not greater than about 2.4. It will be appreciated that the $D_{50}$ of the first filler precursor material may be any value between, and including, any of the minimum and maximum values noted above. It will be further appreciated that the $D_{50}$ of the first filler precursor material may be within a range between, and including, any of the minimum and maximum values noted above.

According to other embodiments, the first filler precursor material may have a particular size distribution $D_{90}$ value. For example, the $D_{90}$ of the first filler precursor material may be at least about 1.5 microns, such as, at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.2 microns or at least about 2.5 microns or at least about 2.6 microns or even at least about 2.7 microns. According to still other embodiments, the $D_{90}$ of the first filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the first filler precursor material may be any value between, and including, any of the minimum and maximum values noted above. It will be further appreciated that the $D_{90}$ of the first filler precursor material may be within a range between, and including, any of the minimum and maximum values noted above.

According to still other embodiments, the first filler precursor material may have a particular mean particle size as measured using laser diffraction spectroscopy. For example, the mean particle size of the first filler precursor material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the first filler precursor material may be any value between, and including, any of the values noted above. It will be further appreciated that the mean particle size of the first filler precursor material may be within a range between, and including, any of the values noted above.

According to still other embodiments, the first filler precursor material may be described as having a particular particle size distribution span (PSDS), where the PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material. For example, the PSDS of the first filler precursor material may be not greater than about 5, such as, not greater than about 4.5 or not greater than about 4.0 or not greater than about 3.5 or not greater than about 3.0 or even not greater than about 2.5. It will be appreciated that the PSDS of the first filler precursor material may be any value between, and including, any of the values noted above. It will be further appreciated that the PSDS of the first filler precursor material may be within a range between, and including, any of the values noted above.

According to still other embodiments, the first filler precursor material may be described as having a particular average surface area as measured using Brunauer-Emmett-Teller (BET) surface area analysis (Nitrogen Adsorption). For example, the first filler precursor material may have an average surface area of not greater than about 8 $m^2/g$, such as, not greater than about 7.9 $m^2/g$ or not greater than about 7.5 $m^2/g$ or not greater than about 7.0 $m^2/g$ or not greater than about 6.5 $m^2/g$ or not greater than about 6.0 $m^2/g$ or not greater than about 5.5 m²/g or not greater than about 5.0 m²/g or not greater than about 4.5 m²/g or not greater than about 4.0 m²/g or even not greater than about 3.5 m²/g. According to still other embodiments, the first filler precursor material may have an average surface area of at least about 1.2 m²/g, such as, at least about 2.2 m²/g. It will be appreciated that the average surface area of the first filler precursor material may be any value between, and including, any of the minimum and maximum values noted above. It will be further appreciated that the average surface area of the first filler precursor material may be within a range between, and including, any of the minimum and maximum values noted above.

According to other embodiments, the first filler precursor material may include a particular material. According to particular embodiments, the first filler precursor material may include a silica based compound. According to still other embodiments, the first filler precursor material may consist of a silica based compound. According to other embodiments, the first filler precursor material may include silica. According to still other embodiments, the first filler precursor material may consist of silica.

According to yet other embodiments, the forming mixture may include a particular content of the ceramic filler precursor component. For example, the content of the ceramic filler precursor component may be at least about 45 vol. % for a total volume of the forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the ceramic filler precursor component may be not greater than about 57 vol. % for a total volume of the forming mixture, such as, not greater than about 56 vol. % or even not greater than about 55 vol. %. It will be appreciated that the content of the ceramic filler precursor component may be any value between, and including, any of the minimum and maximum values noted above. It will be further appreciated that the content of the ceramic filler precursor component may be within a range between, and including, any of the minimum and maximum values noted above.

According to still other embodiments, the ceramic filler precursor component may include a particular content of the first filler precursor material. For example, the content of the first filler precursor material may be at least about 80 vol. % for a total volume of the ceramic filler precursor component, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the first filler precursor material may be not greater than about 100 vol. % for a total volume of the ceramic filler precursor component, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the first filler precursor material may be any value between, and including, any of the minimum and maximum values noted above. It will be further appreciated that the content of the first filler precursor material may be within a range between, and including, any of the minimum and maximum values noted above.

According to still other embodiments, the ceramic filler precursor component may include a second filler precursor material.

According to yet other embodiments, the second filler precursor material may include a particular material. For example, the second filler precursor material may include a high dielectric constant ceramic material, such as, a ceramic material having a dielectric constant of at least about 14. According to particular embodiments, the second filler precursor material may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the second filler precursor material may include $TiO_2$. According to still other embodiments, the second filler precursor material may consist of $TiO_2$.

According to still other embodiments, the ceramic filler precursor component may include a particular content of the second filler precursor material. For example, the content of the second filler precursor material may be at least about 1 vol. % for a total volume of the ceramic filler precursor component, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the second filler precursor material may be not greater than about 20 vol. % for a total volume of the ceramic filler precursor component, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the second filler precursor material may be any value between, and including, any of the minimum and maximum values noted above. It will be further appreciated that the content of the second filler precursor material may be within a range between, and including, any of the minimum and maximum values noted above.

According to yet other embodiments, the ceramic filler precursor component may include a particular content of amorphous material. For example, the ceramic filler precursor component may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

Figure 4:
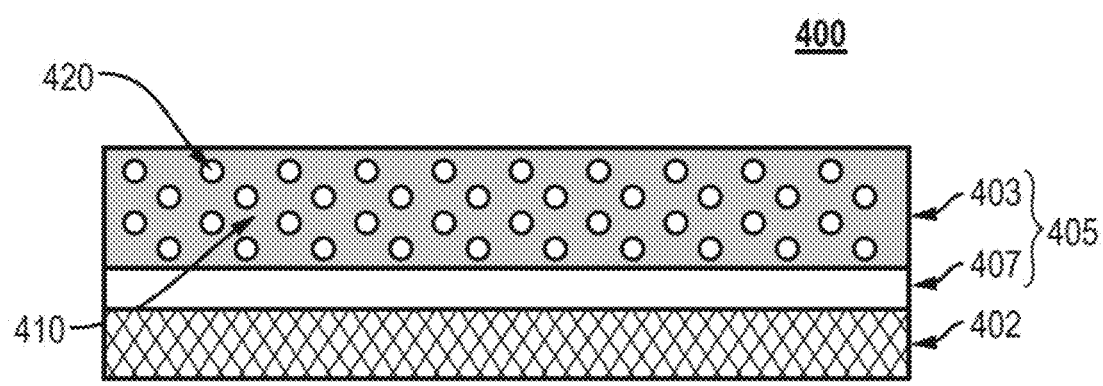
FIG. 4 includes an illustration showing the configuration of a copper-clad laminate formed according to embodiments described herein.

Referring now to embodiments of the copper-clad laminate formed according to forming method 300, FIG. 4 includes a diagram of a copper-clad lamination 400. As shown in FIG. 4, the copper-clad laminate 400 may include a copper foil layer 402, and a dielectric substrate 405 overlying a surface of the copper foil layer 402. As further shown in FIG. 4, the dielectric substrate 405 may include a polymer based core film 403, and a fluoropolymer based adhesive layer 407. As also further shown in FIG. 4, the polymer based core film 403 may include a resin matrix component 410 and a ceramic filler component 420.

According to particular embodiments, the ceramic filler component 420 may include a first filler material, which may have particular characteristics that may improve performance of the copper-clad laminate 400.

According to certain embodiments, the first filler material of the ceramic filler component 420 may have a particular size distribution. For purposes of embodiments described herein, the particle size distribution of a material, for example, the particle size distribution of a first filler material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the first filler material of the ceramic filler component 420 may have a particular size distribution $D_{10}$ value. For example, the $D_{10}$ of the first filler material may be at least about 0.5 microns, such as, at least about 0.6 microns or at least about 0.7 microns or at least about 0.8 microns or at least about 0.9 microns or at least about 1.0 microns or at least about 1.1 microns or even at least about 1.2 microns. According to still other embodiments, the $D_{10}$ of the first filler material may be not greater than about 1.6 microns, such as, not greater than about 1.5 microns or even not greater than about 1.4 microns. It will be appreciated that the $D_{10}$ of the first filler material may be any value between, and including, any of the minimum and maximum values noted above. It will be further appreciated that the $D_{10}$ of the first filler material may be within a range between, and including, any of the minimum and maximum values noted above.

According to other embodiments, the first filler material of the ceramic filler component 420 may have a particular size distribution $D_{50}$ value. For example, the $D_{50}$ of the first filler material may be at least about 0.8 microns, such as, at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the first filler material may be not greater than about 2.7 microns, such as, not greater than about 2.6 microns or not greater than about 2.5 microns or even not greater than about 2.4. It will be appreciated that the $D_{50}$ of the first filler material may be any value between, and including, any of the minimum and maximum values noted above. It will be further appreciated that the $D_{50}$ of the first filler material may be within a range between, and including, any of the minimum and maximum values noted above.

According to other embodiments, the first filler material of the ceramic filler component 420 may have a particular size distribution $D_{90}$ value. For example, the $D_{90}$ of the first filler material may be at least about 1.5 microns, such as, at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.2 microns or at least about 2.5 microns or at least about 2.6 microns or even at least about 2.7 microns. According to still other embodiments, the $D_{90}$ of the first filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the first filler material may be any value between, and including, any of the minimum and maximum values noted above. It will be further appreciated that the $D_{90}$ of the first filler material may be within a range between, and including, any of the minimum and maximum values noted above.

According to still other embodiments, the first filler material of the ceramic filler component 420 may have a particular mean particle size as measured according to laser diffraction spectroscopy. For example, the mean particle size of the first filler material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the first filler material may be any value between, and including, any of the values noted above. It will be further appreciated that the mean particle size of the first filler material may be within a range between, and including, any of the values noted above.

According to still other embodiments, the first filler material of the ceramic filler component 420 may be described as having a particular particle size distribution span (PSDS), where the PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material. For example, the PSDS of the first filler material may be not greater than about 5, such as, not greater than about 4.5 or not greater than about 4.0 or not greater than about 3.5 or not greater than about 3.0 or even not greater than about 2.5. It will be appreciated that the PSDS of the first filler material may be any value between, and including, any of the values noted above. It will be further appreciated that the PSDS of the first filler material may be within a range between, and including, any of the values noted above.

According to still other embodiments, the first filler material of the ceramic filler component 420 may be described as having a particular average surface area as measured using Brunauer-Emmett-Teller (BET) surface area analysis (Nitrogen Adsorption). For example, the first filler material may have an average surface area of not greater than about 8 m$^2$/g, such as, not greater than about 7.9 m$^2$/g or not greater than about 7.5 m$^2$/g or not greater than about 7.0 m$^2$/g or not greater than about 6.5 m$^2$/g or not greater than about 6.0 m$^2$/g or not greater than about 5.5 m$^2$/g or not greater than about 5.0 m$^2$/g or not greater than about 4.5 m$^2$/g or not greater than about 4.0 m$^2$/g or even not greater than about 3.5 m$^2$/g. According to still other embodiments, the first filler material may have an average surface area of at least about 1.2 m$^2$/g, such as, at least about 2.2 m$^2$/g. It will be appreciated that the average surface area of the first filler material may be any value between, and including, any of the minimum and maximum values noted above. It will be further appreciated that the average surface area of the first filler material may be within a range between, and including, any of the minimum and maximum values noted above.

According to still other embodiments, the fluoropolymer based adhesive layer 407 may have a particular average thickness. For example, the average thickness of the adhesive layer 407 may be at least about 0.2 microns, such as, at least about 0.5 microns or at least about 1.0 microns or at least about 1.5 microns or at least about 2.0 microns or at least about 2.5 microns or even at least about 3.0 microns. According to yet other embodiments, the average thickness of the adhesive layer 407 may be not greater than about 7 microns, such as, not greater than about 6.5 or not greater than about 6.0 or not greater than about 5.5 or not greater than about 5.0 not greater than about 4.9 microns or not greater than about 4.8 microns or not greater than about 4.7 microns or not greater than about 4.6 microns or not greater than about 4.5 microns or not greater than about 4.4 microns or not greater than about 4.3 microns or not greater than about 4.2 microns or not greater than about 4.1 microns or not greater than about 4.1 microns or not greater than about 4.0 microns or not greater than about 3.9 microns or not greater than about 3.8 microns or not greater than about 3.7 microns or not greater than about 3.6 microns or even not greater than about 3.5 microns. It will be appreciated that the average thickness of the adhesive layer 407 may be any value between, and including, any of the minimum and maximum values noted above. It will be further appreciated that the average thickness of the adhesive layer 407 may be within a range between, and including, any of the minimum and maximum values noted above.

According to still other embodiments, the fluoropolymer based adhesive layer 407 may include a particular material. For example, the fluoropolymer based adhesive layer 207 may include, but is not limited to, fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 407 may consist of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

According to other embodiments, the first filler material of the ceramic filler component 420 may include a particular material. According to particular embodiments, the first filler material may include a silica based compound. According to still other embodiments, the first filler material may consist of a silica based compound. According to other embodiments, the first filler material may include silica. According to still other embodiments, the first filler material may consist of silica.

According to yet other embodiments, the polymer based core film 403 may include a particular content of the ceramic filler component 420. For example, the content of the ceramic filler component 420 may be at least about 45 vol. % for a total volume of the polymer based core film 203, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the ceramic filler component 420 may be not greater than about 57 vol. % for a total volume of the polymer based core film 203, such as, not greater than about 56 vol. % or even not greater than about 55 vol. %. It will be appreciated that the content of the ceramic filler component 420 may be any value between, and including, any of the minimum and maximum values noted above. It will be further appreciated that the content of the ceramic filler component 420 may be within a range between, and including, any of the minimum and maximum values noted above.

According to yet other embodiments, the dielectric substrate 405 may include a particular content of the ceramic filler component 420. For example, the content of the ceramic filler component 420 may be at least about 45 vol. % for a total volume of the dielectric substrate 405, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the ceramic filler component 420 may be not greater than about 57 vol. % for a total volume of the dielectric substrate 400, such as, not greater than about 56 vol. % or even not greater than about 55 vol. %. It will be appreciated that the content of the ceramic filler component 420 may be any value between, and including, any of the minimum and maximum values noted above. It will be further appreciated that the content of the ceramic filler component 420 may be within a range between, and including, any of the minimum and maximum values noted above.

According to still other embodiments, the ceramic filler component 420 may include a particular content of the first filler material. For example, the content of the first filler material may be at least about 80 vol. % for a total volume of the ceramic filler component 420, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the first filler material may be not greater than about 100 vol. % for a total volume of the ceramic filler component 220, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the first filler material may be any value between, and including, any of the minimum and maximum values noted above. It will be further appreciated that the content of the first filler material may be within a range between, and including, any of the minimum and maximum values noted above.

According to still other embodiments, the ceramic filler component 420 may include a second filler material.

According to yet other embodiments, the second filler material of the ceramic filler component 420 may include a particular material. For example, the second filler material may include a high dielectric constant ceramic material, such as, a ceramic material having a dielectric constant of at least about 14. According to particular embodiments, the second filler material of the ceramic filler component 420 may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the second filler material of the ceramic filler component 420 may include TiO$_2$. According to still other embodiments, the second filler material may consist of TiO$_2$.

According to still other embodiments, the ceramic filler component 420 may include a particular content of the second filler material. For example, the content of the second filler material may be at least about 1 vol. % for a total volume of the ceramic filler component 420, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the second filler material may be not greater than about 20 vol. % for a total volume of the ceramic filler component 220, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the second filler material may be any value between, and including, any of the minimum and maximum values noted above. It will be further appreciated that the content of the second filler material may be within a range between, and including, any of the minimum and maximum values noted above.

According to yet other embodiments, the ceramic filler component 420 may include a particular content of amorphous material. For example, the ceramic filler component 420 may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

According to other embodiments, the resin matrix component 410 may include a particular material. For example, the resin matrix component 410 may include a perfluoropolymer. According to still other embodiments, the resin matrix component 410 may consist of a perfluoropolymer.

According to yet other embodiments, the perfluoropolymer of the resin matrix component 410 may include a copolymer of tetrafluoroethylene (TFE); a copolymer of hexafluoropropylene (HFP); a terpolymer of tetrafluoroethylene (TFE); or any combination thereof. According to other embodiments, the perfluoropolymer of the resin matrix component 410 may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the resin matrix component 410 may include polytetrafluoroethylene (PTFE), perfluoroalkoxy polymer resin (PFA), fluorinated ethylene propylene (FEP), or any combination thereof. According to still other embodiments, the perfluoropolymer of the resin matrix component 410 may consist of polytetrafluoroethylene (PTFE), perfluoroalkoxy polymer resin (PFA), fluorinated ethylene propylene (FEP), or any combination thereof.

According to yet other embodiments, the polymer based core film 403 may include a particular content of the resin matrix component 410. For example, the content of the resin matrix component 410 may be at least about 45 vol. % for a total volume of the dielectric substrate 400, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the resin matrix component 410 is not greater than about 63 vol. % for a total volume of the polymer based core film 403 or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the resin matrix component 410 may be any value between, and including, any of the minimum and maximum values noted above. It will be further appreciated that the content of the resin matrix component 410 may be within a range between, and including, any of the minimum and maximum values noted above.

According to yet other embodiments, the dielectric substrate 400 may include a particular content of the resin matrix component 410. For example, the content of the resin matrix component 410 may be at least about 45 vol. % for a total volume of the dielectric substrate 400, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or at least about 55 vol. %. According to still other embodiments, the content of the resin matrix component 410 is not greater than about 63 vol. % for a total volume of the dielectric substrate 400 or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the resin matrix component 410 may be any value between, and including, any of the minimum and maximum values noted above. It will be further appreciated that the content of the resin matrix component 410 may be within a range between, and including, any of the minimum and maximum values noted above.

According to yet other embodiments, the polymer based core film 403 may include a particular content of the perfluoropolymer. For example, the content of the perfluoropolymer may be at least about 45 vol. % for a total volume of the dielectric substrate 405, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the polymer based core film 403, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

According to yet other embodiments, the dielectric substrate 405 may include a particular content of the perfluoropolymer. For example, the content of the perfluoropolymer may be at least about 45 vol. % for a total volume of the dielectric substrate 405, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the dielectric substrate 200, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

According to still other embodiments, the polymer based core film 403 may include a particular porosity as measured using x-ray diffraction. For example, the porosity of the substrate 405 may be not greater than about 10 vol. %, such as, not greater than about 9 vol. % or not greater than about 8 vol. % or not greater than about 7 vol. % or not greater than about 6 vol. % or even not greater than about 5 vol. %. It will be appreciated that the porosity of the polymer based core film 403 may be any value between, and including, any of the values noted above. It will be further appreciated that the porosity of the polymer based core film 403 may be within a range between, and including, any of the values noted above.

According to yet other embodiments, the polymer based core film 403 may have a particular average thickness. For example, the average thickness of the polymer based core film 403 may be at least about 10 microns, such as, at least about 15 microns or at least about 20 microns or at least about 25 microns or at least about 30 microns or at least about 35 microns or at least about 40 microns or at least about 45 microns or at least about 50 microns or at least about 55 microns or at least about 60 microns or at least about 65 microns or at least about 70 microns or even at least about 75 microns. According to yet other embodiments, the average thickness of the polymer based core film 403 may be not greater than about 2000 microns, such as, not greater than about 1800 microns or not greater than about 1600 microns or not greater than about 1400 microns or not greater than about 1200 microns or not greater than about 1000 microns or not greater than about 800 microns or not greater than about 600 microns or not greater than about 400 microns or not greater than about 200 microns or not greater than about 190 microns or not greater than about 180 microns or not greater than about 170 microns or not greater than about 160 microns or not greater than about 150 microns or not greater than about 140 microns or not greater than about 120 microns or even not greater than about 100 microns. It will be appreciated that the average thickness of the polymer based core film 403 may be any value between, and including, any of the minimum and maximum values noted above. It will be further appreciated that the average thickness of the polymer based core film 403 may be within a range between, and including, any of the minimum and maximum values noted above.

According to yet other embodiments, the polymer based core film 403 may have a particular dissipation factor (Df) as measured in the range between 5 GHz, 20% RH. For example, the polymer based core film 403 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 403 may be any value between, and including, any of the values noted above. It will be further appreciated that the dissipation factor of the polymer based core film 403 may be within a range between, and including, any of the values noted above.

According to yet other embodiments, the polymer based core film 403 may have a particular dissipation factor (Df) as measured in the range between 5 GHz, 80% RH. For example, the polymer based core film 403 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 403 may be any value between, and including, any of the values noted above. It will be further appreciated that the dissipation factor of the polymer based core film 403 may be within a range between, and including, any of the values noted above.

According to yet other embodiments, the polymer based core film 403 may have a particular dissipation factor (Df) as measured in the range between 10 GHz, 20% RH. For example, the polymer based core film 403 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 403 may be any value between, and including, any of the values noted above. It will be further appreciated that the dissipation factor of the polymer based core film 403 may be within a range between, and including, any of the values noted above.

According to yet other embodiments, the polymer based core film 403 may have a particular dissipation factor (Df) as measured in the range between 10 GHz, 80% RH. For example, the polymer based core film 403 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 403 may be any value between, and including, any of the values noted above. It will be further appreciated that the dissipation factor of the polymer based core film 403 may be within a range between, and including, any of the values noted above.

According to yet other embodiments, the polymer based core film 403 may have a particular dissipation factor (Df) as measured in the range between 28 GHz, 20% RH. For example, the polymer based core film 403 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 403 may be any value between, and including, any of the values noted above. It will be further appreciated that the dissipation factor of the polymer based core film 403 may be within a range between, and including, any of the values noted above.

According to yet other embodiments, the polymer based core film 403 may have a particular dissipation factor (Df) as measured in the range between 28 GHz, 80% RH. For example, the polymer based core film 403 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 403 may be any value between, and including, any of the values noted above. It will be further appreciated that the dissipation factor of the polymer based core film 403 may be within a range between, and including, any of the values noted above.

According to yet other embodiments, the polymer based core film 403 may have a particular dissipation factor (Df) as measured in the range between 39 GHz, 20% RH. For example, the polymer based core film 403 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 403 may be any value between, and including, any of the values noted above. It will be further appreciated that the dissipation factor of the polymer based core film 403 may be within a range between, and including, any of the values noted above.

According to yet other embodiments, the polymer based core film 403 may have a particular dissipation factor (Df) as measured in the range between 39 GHz, 80% RH. For example, the polymer based core film 403 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 403 may be any value between, and including, any of the values noted above. It will be further appreciated that the dissipation factor of the polymer based core film 403 may be within a range between, and including, any of the values noted above.

According to yet other embodiments, the polymer based core film 403 may have a particular dissipation factor (Df) as measured in the range between 76-81 GHz, 20% RH. For example, the polymer based core film 403 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 403 may be any value between, and including, any of the values noted above. It will be further appreciated that the dissipation factor of the polymer based core film 403 may be within a range between, and including, any of the values noted above.

According to yet other embodiments, the polymer based core film 403 may have a particular dissipation factor (Df) as measured in the range between 76-81 GHz, 80% RH. For example, the polymer based core film 403 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the polymer based core film 403 may be any value between, and including, any of the values noted above. It will be further appreciated that the dissipation factor of the polymer based core film 403 may be within a range between, and including, any of the values noted above.

According to yet other embodiments, the polymer based core film 403 may have a particular coefficient of thermal expansion as measured according to IPC-TM-650 2.4.24 Rev. C Glass Transition Temperature and Z-Axis Thermal Expansion by TMA. For example, the polymer based core film 403 may have a coefficient of thermal expansion of not greater than about 80 ppm/° C.

According to still other embodiments, the dielectric substrate 405 may include a particular porosity as measured using x-ray diffraction. For example, the porosity of the substrate 405 may be not greater than about 10 vol. %, such as, not greater than about 9 vol. % or not greater than about 8 vol. % or not greater than about 7 vol. % or not greater than about 6 vol. % or even not greater than about 5 vol. %. It will be appreciated that the porosity of the dielectric substrate 405 may be any value between, and including, any of the values noted above. It will be further appreciated that the porosity of the dielectric substrate 405 may be within a range between, and including, any of the values noted above.

According to yet other embodiments, the dielectric substrate 405 may have a particular average thickness. For example, the average thickness of the dielectric substrate 405 may be at least about 10 microns, such as, at least about 15 microns or at least about 20 microns or at least about 25 microns or at least about 30 microns or at least about 35 microns or at least about 40 microns or at least about 45 microns or at least about 50 microns or at least about 55 microns or at least about 60 microns or at least about 65 microns or at least about 70 microns or even at least about 75 microns. According to yet other embodiments, the average thickness of the dielectric substrate 405 may be not greater than about 2000 microns, such as, not greater than about 1800 microns or not greater than about 1600 microns or not greater than about 1400 microns or not greater than about 1200 microns or not greater than about 1000 microns or not greater than about 800 microns or not greater than about 600 microns or not greater than about 400 microns or not greater than about 200 microns or not greater than about 190 microns or not greater than about 180 microns or not greater than about 170 microns or not greater than about 160 microns or not greater than about 150 microns or not greater than about 140 microns or not greater than about 120 microns or even not greater than about 100 microns. It will be appreciated that the average thickness of the dielectric substrate 405 may be any value between, and including, any of the minimum and maximum values noted above. It will be further appreciated that the average thickness of the dielectric substrate 405 may be within a range between, and including, any of the minimum and maximum values noted above.

According to yet other embodiments, the dielectric substrate 405 may have a particular dissipation factor (Df) as measured in the range between 5 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 5 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 10 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 10 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 28 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 28 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 39 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 39 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 76-81 GHz, 20% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular dissipation factor (Df) as measured in the range between 76-81 GHz, 80% RH. For example, the dielectric substrate 405 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric substrate 405 may be any value between, and including, any of the values noted above. It will be further appreciated that the dissipation factor of the dielectric substrate 405 may be within a range between, and including, any of the values noted above.

According to yet other embodiments, the dielectric substrate 405 may have a particular coefficient of thermal expansion as measured according to IPC-TM-650 2.4.24 Rev. C Glass Transition Temperature and Z-Axis Thermal Expansion by TMA. For example, the dielectric substrate 405 may have a coefficient of thermal expansion of not greater than about 80 ppm/° C.

It will be appreciated that any copper-clad laminate described herein may include additional polymer based layers on the outer surfaces of the originally described dielectric substrate between the substrate and any copper foil layer of the copper-clad laminate. As also noted herein, the additional polymer based layers may include filler (i.e. be filled polymer layers) as described herein or may not include fillers (i.e. be unfilled polymer layers).

Figure 5:
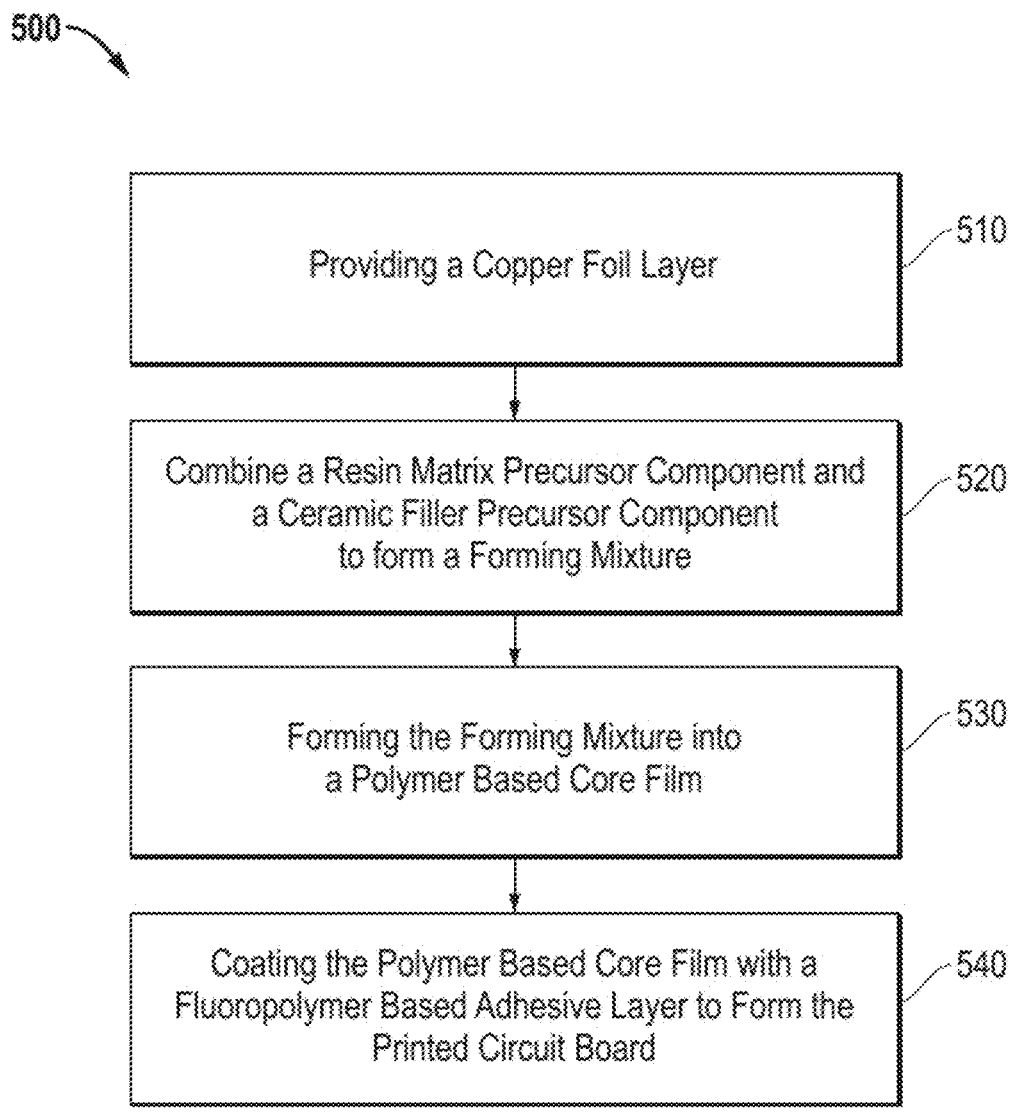
FIG. 5 includes a diagram showing a printed circuit board forming method according to embodiments described herein.

Referring next to a method of forming a printed circuit board, FIG. 5 includes a diagram showing a forming method 500 for forming a printed circuit board according to embodiments described herein. According to particular embodiments, the forming method 500 may include a first step 510 of providing a copper foil layer, a second step 520 of combining a resin matrix precursor component and a ceramic filler precursor component to form a forming mixture, a third step 530 of forming the forming mixture into a polymer based core film, a fourth step 540 of coating the polymer based core film with a fluoropolymer based adhesive layer to form a copper-clad laminate, and a fourth step 550 of forming the copper-clad laminate into a printed circuit board.

It will be appreciated that all description, details and characteristics provided herein in reference to forming method 100 and/or forming method 300 may further apply to or describe correspond aspects of forming method 500.

Figure 6:
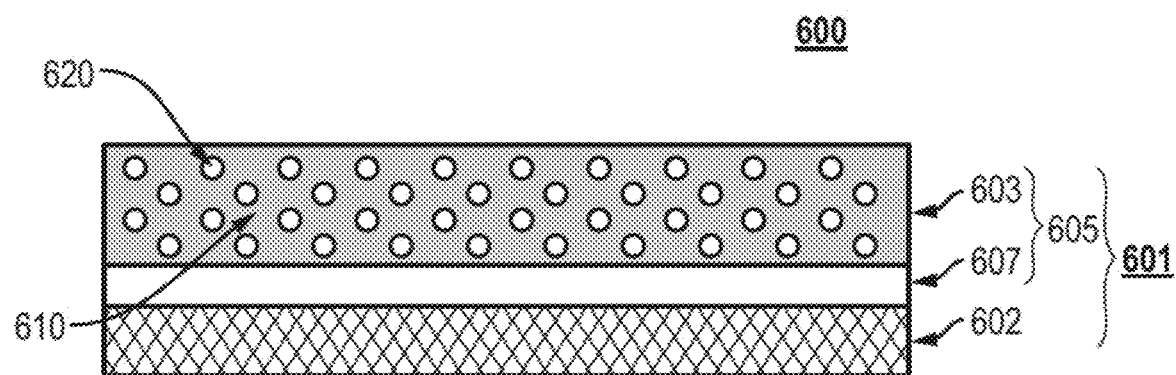
FIG. 6 includes an illustration showing the configuration of a printed circuit board formed according to embodiments described herein.

Referring now to embodiments of the printed circuit board formed according to forming method 500, FIG. 6 includes diagram of a printed circuit board 600. As shown in FIG. 6, the printed circuit board 600 may include a copper-clad laminate 601, which may include a copper foil layer 602, and a dielectric substrate 605 overlying a surface of the copper foil layer 402. As further shown in FIG. 6, the dielectric substrate 605 may include a polymer based core film 603, and a fluoropolymer based adhesive layer 607. As also further shown in FIG. 6, the polymer based core film 603 may include a resin matrix component 610 and a ceramic filler component 620.

Again, it will be appreciated that all description provided herein in reference to dielectric substrate 200 (405) and/or copper-clad laminate 400 may further apply to correcting aspects of the printed circuit board 600, including all component of printed circuit board 600.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the embodiments as listed below.

Embodiment 1. A dielectric substrate comprising: a polymer based core film, and a fluoropolymer based adhesive layer, wherein the polymer based core film comprises: a resin matrix component; and a ceramic filler component, wherein the ceramic filler component comprises a first filler material, and wherein a particle size distribution of the first filler material comprises: a $D_{10}$ of at least about 0.5 microns and not greater than about 1.6 microns, a $D_{50}$ of at least about 0.8 microns and not greater than about 2.7 microns, and a $D_{90}$ of at least about 1.5 microns and not greater than about 4.7 microns.

Embodiment 2. A dielectric substrate comprising: a polymer based core film, and a fluoropolymer based adhesive layer, wherein the polymer based core film comprises: a resin matrix component; and a ceramic filler component, wherein the ceramic filler component comprises a first filler material, wherein the first filler material further comprises a mean particle size of not greater than about 10 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

Embodiment 3. A dielectric substrate comprising: a polymer based core film, and a fluoropolymer based adhesive layer, wherein the polymer based core film comprises: a resin matrix component; and a ceramic filler component, wherein the ceramic filler component comprises a first filler material, and wherein the first filler material further comprises a mean particle size of at not greater than about 10 microns, and an average surface area of not greater than about 8 m²/g.

Embodiment 4. The dielectric substrate of any one of embodiments 2 and 3, wherein a particle size distribution of the first filler material comprises a $D_{10}$ of at least about 0.5 microns and not greater than about 1.6 microns.

Embodiment 5. The dielectric substrate of any one of embodiments 2 and 3, wherein a particle size distribution of the first filler material comprises a $D_{50}$ of at least about 0.8 microns and not greater than about 2.7 microns.

Embodiment 6. The dielectric substrate of any one of embodiments 2 and 3, wherein a particle size distribution of the first filler material comprises a $D_{90}$ of at least about 1.5 microns and not greater than about 4.7 microns.

Embodiment 7. The dielectric substrate of embodiment 1, wherein the first filler material further comprises a mean particle size of at not greater than about 10 microns.

Embodiment 8. The dielectric substrate of any one of embodiments 2, 3, and 7, wherein the first filler material comprises a mean particle size of not greater than about 10 microns or not greater than about 9 microns or not greater than about 8 microns or not greater than about 7 microns or not greater than about 6 microns or not greater than about 5 microns or not greater than about 4 microns or not greater than about 3 microns or not greater than about 2 microns.

Embodiment 9. The dielectric substrate of any one of embodiments 1 and 3, wherein the first filler material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

Embodiment 10. The dielectric substrate of any one of embodiments 1 and 2, wherein the first filler material further comprises an average surface area of not greater than about 8 $m^2/g$.

Embodiment 11. The dielectric substrate of any one of embodiments 1, 2, and 3, wherein the fluoropolymer based adhesive layer has an average thickness of at least about 0.2 microns.

Embodiment 12. The dielectric substrate of any one of embodiments 1, 2, and 3, wherein the fluoropolymer based adhesive layer has an average thickness of not greater than about 7 microns.

Embodiment 13. The dielectric substrate of any one of embodiments 1, 2, and 3, wherein the fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene.

Embodiment 14. The dielectric substrate of any one of embodiments 1, 2, and 3, wherein the fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene.

Embodiment 15. The dielectric substrate of any one of embodiments 1, 2, and 3, wherein the fluoropolymer based adhesive layer is a PFA layer.

Embodiment 16. The dielectric substrate of any one of embodiments 1, 2, and 3, wherein the first filler material comprises a silica based compound.

Embodiment 17. The dielectric substrate of any one of embodiments 1, 2, and 3, wherein the first filler material comprises silica.

Embodiment 18. The dielectric substrate of any one of embodiments 1, 2, and 3, wherein the resin matrix comprises a perfluoropolymer.

Embodiment 19. The dielectric substrate of embodiment 18, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 20. The dielectric substrate of embodiment 18, wherein the perfluoropolymer comprises polytetrafluoroethylene (PTFE), perfluoroalkoxy polymer resin (PFA), fluorinated ethylene propylene (FEP), or any combination thereof.

Embodiment 21. The dielectric substrate of embodiment 18, wherein the perfluoropolymer consists of polytetrafluoroethylene (PTFE), perfluoroalkoxy polymer resin (PFA), fluorinated ethylene propylene (FEP), or any combination thereof.

Embodiment 22. The dielectric substrate of any one of embodiments 1, 2, and 3, wherein the content of the resin matrix component is at least about 45 vol. % for a total volume of the polymer based core film.

Embodiment 23. The dielectric substrate of any one of embodiments 1, 2, and 3, wherein the content of the resin matrix component is not greater than about 63 vol. % for a total volume of the polymer based core film.

Embodiment 24. The dielectric substrate of embodiment 18, wherein the content of the perfluoropolymer is at least about 45 vol. % for a total volume of the polymer based core film.

Embodiment 25. The dielectric substrate of embodiment 18, wherein the content of the perfluoropolymer is not greater than about 63 vol. % for a total volume of the polymer based core film.

Embodiment 26. The dielectric substrate of any one of embodiments 1, 2, and 3, wherein the content of the ceramic filler component is at least about 45 vol. % for a total volume of the polymer based core film.

Embodiment 27. The dielectric substrate of any one of embodiments 1, 2, and 3, wherein the content of the ceramic filler component is not greater than about 57 vol. % for a total volume of the polymer based core film.

Embodiment 28. The dielectric substrate of any one of embodiments 1, 2, and 3, wherein the content of the first filler material is at least about 80 vol. % for a total volume of the ceramic filler component.

Embodiment 29. The dielectric substrate of any one of embodiments 1, 2, and 3, wherein the content of the first filler material is not greater than about 100 vol. % for a total volume of the ceramic filler component.

Embodiment 30. The dielectric substrate of any one of embodiments 1, 2, and 3, wherein the ceramic filler component further comprises a second filler material.

Embodiment 31. The dielectric substrate of embodiment 30, wherein the second filler material comprises a high dielectric constant ceramic material.

Embodiment 32. The dielectric substrate of embodiment 31, wherein the high dielectric constant ceramic material has a dielectric constant of at least about 14.

Embodiment 33. The dielectric substrate of embodiment 31, wherein the ceramic filler component further comprises $TiO_2$, $SrTiO_3$, $ZrTi_2O_6$, $MgTiO_3$, $CaTiO_3$, $BaTiO_4$ or any combination thereof.

Embodiment 34. The dielectric substrate of embodiment 30, wherein the content of the second filler material is at least about 1 vol. % for a total volume of the ceramic filler component.

Embodiment 35. The dielectric substrate of embodiment 30, wherein the content of the second filler material is not greater than about 20 vol. % for a total volume of the ceramic filler component.

Embodiment 36. The dielectric substrate of any one of embodiments 1, 2, and 3, wherein the ceramic filler component is at least about 97% amorphous.

Embodiment 37. The dielectric substrate of any one of embodiments 1, 2, and 3, wherein the polymer based core film comprises a porosity of not greater than about 10 vol. %.

Embodiment 38. The dielectric substrate of any one of embodiments 1, 2, and 3, wherein the polymer based core film comprises an average thickness of at least about 10 microns.

Embodiment 39. The dielectric substrate of any one of embodiments 1, 2, and 3, wherein the polymer based core film comprises an average thickness of not greater than about 2000 microns.

Embodiment 40. The dielectric substrate of any one of embodiments 1, 2, and 3, wherein the dielectric substrate comprises a dissipation factor (5 GHz, 20% RH) of not greater than about 0.005.

Embodiment 41. The dielectric substrate of any one of embodiments 1, 2, and 3, wherein the dielectric substrate comprises a dissipation factor (5 GHz, 20% RH) of not greater than about 0.0014.

Embodiment 42. The dielectric substrate of any one of embodiments 1, 2, and 3, wherein the dielectric substrate comprises a coefficient of thermal expansion (all axes) of not greater than about 80 ppm/° C.

Embodiment 43. The dielectric substrate of any one of embodiments 1, 2, and 3, wherein the dielectric substrate comprises a moisture absorption of not greater than about 0.05%.

Embodiment 44. A copper-clad laminate comprising: a copper foil layer, and a dielectric substrate overlying the copper foil layer, wherein the dielectric substrate comprises: a polymer based core film, and a fluoropolymer based adhesive layer, wherein the polymer based core film comprises: a resin matrix component; and a ceramic filler component, wherein the ceramic filler component comprises a first filler material, and wherein a particle size distribution of the first filler material comprises: a $D_{10}$ of at least about 0.5 microns and not greater than about 1.6 microns, a $D_{50}$ of at least about 0.8 microns and not greater than about 2.7 microns, and a $D_{90}$ of at least about 1.5 microns and not greater than about 4.7 microns.

Embodiment 45. A copper-clad laminate comprising: a copper foil layer, and a dielectric substrate overlying the copper foil layer, wherein the dielectric substrate comprises: a polymer based core film, and a fluoropolymer based adhesive layer, wherein the polymer based core film comprises: a resin matrix component; and a ceramic filler component, wherein the ceramic filler component comprises a first filler material, wherein the first filler material further comprises a mean particle size of at not greater than about 10 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

Embodiment 46. A copper-clad laminate comprising: a copper foil layer, and a dielectric substrate overlying the copper foil layer, wherein the dielectric substrate comprises: a polymer based core film, and a fluoropolymer based adhesive layer, wherein the polymer based core film comprises: a resin matrix component; and a ceramic filler component, wherein the ceramic filler component comprises a first filler material, and wherein the first filler material further comprises a mean particle size of at not greater than about 10 microns, and an average surface area of not greater than about 8 m²/g.

Embodiment 47. The copper-clad laminate of any one of embodiments 45 and 46, wherein a particle size distribution of the first filler material comprises a $D_{10}$ of at least about 0.5 microns and not greater than about 1.6 microns.

Embodiment 48. The copper-clad laminate of any one of embodiments 45 and 46, wherein a particle size distribution of the first filler material comprises a $D_{50}$ of at least about 0.8 microns and not greater than about 2.7 microns.

Embodiment 49. The copper-clad laminate of any one of embodiments 45 and 46, wherein a particle size distribution of the first filler material comprises a $D_{90}$ of at least about 1.5 microns and not greater than about 4.7 microns.

Embodiment 50. The copper-clad laminate of embodiment 44, wherein the first filler material further comprises a mean particle size of at not greater than about 10 microns.

Embodiment 51. The copper-clad laminate of any one of embodiments 44, 45, and 46, wherein the first filler material comprises a mean particle size of not greater than about 10 microns.

Embodiment 52. The copper-clad laminate of any one of embodiments 44 and 46, wherein the first filler material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

Embodiment 53. The copper-clad laminate of any one of embodiments 44 and 45, wherein the first filler material further comprises an average surface area of not greater than about 8 m²/g.

Embodiment 54. The copper-clad laminate of any one of embodiments 44, 45, and 46, wherein the fluoropolymer based adhesive layer has an average thickness of at least about 0.2 microns.

Embodiment 55. The copper-clad laminate of any one of embodiments 44, 45, and 46, wherein the fluoropolymer based adhesive layer has an average thickness of not greater than about 7 microns.

Embodiment 56. The copper-clad laminate of any one of embodiments 44, 45, and 46, wherein the fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene.

Embodiment 57. The copper-clad laminate of any one of embodiments 44, 45, and 46, wherein the fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene.

Embodiment 58. The copper-clad laminate of any one of embodiments 44, 45, and 46, wherein the fluoropolymer based adhesive layer is a PFA layer.

Embodiment 59. The copper-clad laminate of any one of embodiments 44, 45, and 46, wherein the first filler material comprises a silica based compound.

Embodiment 60. The copper-clad laminate of any one of embodiments 44, 45, and 46, wherein the first filler material comprises silica.

Embodiment 61. The copper-clad laminate of any one of embodiments 44, 45, and 46, wherein the resin matrix comprises a perfluoropolymer.

Embodiment 62. The copper-clad laminate of embodiment 61, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 63. The copper-clad laminate of embodiment 61, wherein the perfluoropolymer comprises polytetrafluoroethylene (PTFE), perfluoroalkoxy polymer resin (PFA), fluorinated ethylene propylene (FEP), or any combination thereof.

Embodiment 64. The copper-clad laminate of embodiment 61, wherein the perfluoropolymer consists of polytetrafluoroethylene (PTFE), perfluoroalkoxy polymer resin (PFA), fluorinated ethylene propylene (FEP), or any combination thereof.

Embodiment 65. The copper-clad laminate of any one of embodiments 44, 45, and 46, wherein the content of the resin matrix component is at least about 45 vol. % for a total volume of the polymer based core film.

Embodiment 66. The copper-clad laminate of any one of embodiments 44, 45, and 46, wherein the content of the resin matrix component is not greater than about 63 vol. % for a total volume of the polymer based core film.

Embodiment 67. The copper-clad laminate of embodiment 61, wherein the content of the perfluoropolymer is at least about 45 vol. % for a total volume of the polymer based core film.

Embodiment 68. The copper-clad laminate of embodiment 61, wherein the content of the perfluoropolymer is not greater than about 63 vol. % for a total volume of the polymer based core film.

Embodiment 69. The copper-clad laminate of any one of embodiments 44, 45, and 46, wherein the content of the ceramic filler component is at least about 45 vol. % for a total volume of the polymer based core film.

Embodiment 70. The copper-clad laminate of any one of embodiments 44, 45, and 46, wherein the content of the ceramic filler component is not greater than about 57 vol. % for a total volume of the polymer based core film.

Embodiment 71. The copper-clad laminate of any one of embodiments 44, 45, and 46, wherein the content of the first filler material is at least about 80 vol. % for a total volume of the ceramic filler component.

Embodiment 72. The copper-clad laminate of any one of embodiments 44, 45, and 46, wherein the content of the first filler material is not greater than about 100 vol. % for a total volume of the ceramic filler component.

Embodiment 73. The copper-clad laminate of any one of embodiments 44, 45, and 46, wherein the ceramic filler component further comprises a second filler material.

Embodiment 74. The copper-clad laminate of embodiment 73, wherein the second filler material comprises a high dielectric constant ceramic material.

Embodiment 75. The copper-clad laminate of embodiment 74, wherein the high dielectric constant ceramic material has a dielectric constant of at least about 14.

Embodiment 76. The copper-clad laminate of embodiment 74, wherein the ceramic filler component further comprises $TiO_2$, $SrTiO_3$, $ZrTi_2O_6$, $MgTiO_3$, $CaTiO_3$, $BaTiO_4$ or any combination thereof.

Embodiment 77. The copper-clad laminate of embodiment 73, wherein the content of the second filler material is at least about 1 vol. % for a total volume of the ceramic filler component.

Embodiment 78. The copper-clad laminate of embodiment 73, wherein the content of the second filler material is not greater than about 20 vol. % for a total volume of the ceramic filler component.

Embodiment 79. The copper-clad laminate of any one of embodiments 44, 45, and 46, wherein the ceramic filler component is at least about 97% amorphous.

Embodiment 80. The copper-clad laminate of any one of embodiments 44, 45, and 46, wherein the polymer based core film comprises a porosity of not greater than about 10 vol. %.

Embodiment 81. The copper-clad laminate of any one of embodiments 44, 45, and 46, wherein the polymer based core film comprises an average thickness of at least about 10 microns.

Embodiment 82. The copper-clad laminate of any one of embodiments 44, 45, and 46, wherein the polymer based core film comprises an average thickness of not greater than about 2000 microns.

Embodiment 83. The copper-clad laminate of any one of embodiments 44, 45, and 46, wherein the polymer based core film comprises a dissipation factor (5 GHz, 20% RH) of not greater than about 0.005.

Embodiment 84. The copper-clad laminate of any one of embodiments 44, 45, and 46, wherein the polymer based core film comprises a dissipation factor (5 GHz, 20% RH) of not greater than about 0.0014.

Embodiment 85. The copper-clad laminate of any one of embodiments 44, 45, and 46, wherein the polymer based core film comprises a coefficient of thermal expansion (all axes) of not greater than about 80 ppm/° C.

Embodiment 86. The copper-clad laminate of any one of embodiments 44, 45, and 46, wherein the polymer based core film comprises a moisture absorption of not greater than about 0.05%.

Embodiment 87. The copper-clad laminate of any one of embodiments 44, 45, and 46, wherein the copper-clad laminate comprises a porosity of not greater than about 10 vol. %.

Embodiment 88. The copper-clad laminate of any one of embodiments 44, 45, and 46, wherein the copper-clad laminate comprises a peel strength between the copper foil layer and the dielectric substrate of at least about 6 lb/in.

Embodiment 89. A printed circuit board comprising a copper-clad laminate, wherein the copper-clad laminate comprises: a copper foil layer, and a dielectric substrate overlying the copper foil layer, wherein the dielectric substrate comprises: a polymer based core film, and a fluoropolymer based adhesive layer, wherein the polymer based core film comprises: a resin matrix component; and a ceramic filler component, wherein the ceramic filler component comprises a first filler material, and wherein a particle size distribution of the first filler material comprises: a $D_{10}$ of at least about 0.5 microns and not greater than about 1.6 microns, a $D_{50}$ of at least about 0.8 microns and not greater than about 2.7 microns, and a $D_{90}$ of at least about 1.5 microns and not greater than about 4.7 microns.

Embodiment 90. A printed circuit board comprising a copper-clad laminate, wherein the copper-clad laminate comprises: a copper foil layer, and a dielectric substrate overlying the copper foil layer, wherein the dielectric substrate comprises: a polymer based core film, and a fluoropolymer based adhesive layer, wherein the polymer based core film comprises: a resin matrix component; and a ceramic filler component, wherein the ceramic filler component comprises a first filler material, wherein the first filler material further comprises a mean particle size of at not greater than about 10 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

Embodiment 91. A printed circuit board comprising a copper-clad laminate, wherein the copper-clad laminate comprises: a copper foil layer, and a dielectric substrate overlying the copper foil layer, wherein the dielectric substrate comprises: a polymer based core film, and a fluoropolymer based adhesive layer, wherein the polymer based core film comprises: a resin matrix component; and a ceramic filler component, wherein the ceramic filler component comprises a first filler material, and wherein the first filler material further comprises a mean particle size of at not greater than about 10 microns, and an average surface area of not greater than about 8 m²/g.

Embodiment 92. The printed circuit board of any one of embodiments 90 and 91, wherein a particle size distribution of the first filler material comprises a $D_{10}$ of at least about 0.5 microns and not greater than about 1.6 microns.

Embodiment 93. The printed circuit board of any one of embodiments 90 and 91, wherein a particle size distribution of the first filler material comprises a $D_{50}$ of at least about 0.8 microns and not greater than about 2.7 microns.

Embodiment 94. The printed circuit board of any one of embodiments 90 and 91, wherein a particle size distribution of the first filler material comprises a $D_{90}$ of at least about 1.5 microns and not greater than about 4.7 microns.

Embodiment 95. The printed circuit board of embodiment 89, wherein the first filler material further comprises a mean particle size of at not greater than about 10 microns.

Embodiment 96. The printed circuit board of any one of embodiments 89, 90, and 91, wherein the first filler material comprises a mean particle size of not greater than about 10 microns.

Embodiment 97. The printed circuit board of any one of embodiments 89 and 91, wherein the first filler material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

Embodiment 98. The printed circuit board of any one of embodiments 89 and 90, wherein the first filler material further comprises an average surface area of not greater than about 8 m²/g.

Embodiment 99. The printed circuit board of any one of embodiments 89, 90, and 91, wherein the fluoropolymer based adhesive layer has an average thickness of at least about 0.2 microns.

Embodiment 100. The printed circuit board of any one of embodiments 89, 90, and 91, wherein the fluoropolymer based adhesive layer has an average thickness of not greater than about 7 microns.

Embodiment 101. The printed circuit board of any one of embodiments 89, 90, and 91, wherein the fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene.

Embodiment 102. The printed circuit board of any one of embodiments 89, 90, and 91, wherein the fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene.

Embodiment 103. The printed circuit board of any one of embodiments 89, 90, and 91, wherein the fluoropolymer based adhesive layer is a PFA layer.

Embodiment 104. The printed circuit board of any one of embodiments 89, 90, and 91, wherein the first filler material comprises a silica based compound.

Embodiment 105. The printed circuit board of any one of embodiments 89, 90, and 91, wherein the first filler material comprises silica.

Embodiment 106. The printed circuit board of any one of embodiments 89, 90, and 91, wherein the resin matrix comprises a perfluoropolymer.

Embodiment 107. The printed circuit board of embodiment 106, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 108. The printed circuit board of embodiment 106, wherein the perfluoropolymer comprises polytetrafluoroethylene (PTFE), perfluoroalkoxy polymer resin (PFA), fluorinated ethylene propylene (FEP), or any combination thereof.

Embodiment 109. The printed circuit board of embodiment 106, wherein the perfluoropolymer consists of polytetrafluoroethylene (PTFE), perfluoroalkoxy polymer resin (PFA), fluorinated ethylene propylene (FEP), or any combination thereof.

Embodiment 110. The printed circuit board of any one of embodiments 89, 90, and 91, wherein the content of the resin matrix component is at least about 45 vol. % for a total volume of the polymer based core film.

Embodiment 111. The printed circuit board of any one of embodiments 89, 90, and 91, wherein the content of the resin matrix component is not greater than about 63 vol. % for a total volume of the polymer based core film.

Embodiment 112. The printed circuit board of embodiment 106, wherein the content of the perfluoropolymer is at least about 45 vol. % for a total volume of the polymer based core film.

Embodiment 113. The printed circuit board of embodiment 106, wherein the content of the perfluoropolymer is not greater than about 63 vol. % for a total volume of the polymer based core film.

Embodiment 114. The printed circuit board of any one of embodiments 89, 90, and 91, wherein the content of the ceramic filler component is at least about 45 vol. % for a total volume of the polymer based core film.

Embodiment 115. The printed circuit board of any one of embodiments 89, 90, and 91, wherein the content of the ceramic filler component is not greater than about 57 vol. % for a total volume of the polymer based core film.

Embodiment 116. The printed circuit board of any one of embodiments 89, 90, and 91, wherein the content of the first filler material is at least about 80 vol. % for a total volume of the ceramic filler component.

Embodiment 117. The printed circuit board of any one of embodiments 89, 90, and 91, wherein the content of the first filler material is not greater than about 100 vol. % for a total volume of the ceramic filler component.

Embodiment 118. The printed circuit board of any one of embodiments 89, 90, and 91, wherein the ceramic filler component further comprises a second filler material.

Embodiment 119. The printed circuit board of embodiment 118, wherein the second filler material comprises a high dielectric constant ceramic material.

Embodiment 120. The printed circuit board of embodiment 119, wherein the high dielectric constant ceramic material has a dielectric constant of at least about 14.

Embodiment 121. The printed circuit board of embodiment 119, wherein the ceramic filler component further comprises $TiO_2$, $SrTiO_3$, $ZrTi_2O_6$, $MgTiO_3$, $CaTiO_3$, $BaTiO_4$ or any combination thereof.

Embodiment 122. The printed circuit board of embodiment 118, wherein the content of the second filler material is at least about 1 vol. % for a total volume of the ceramic filler component.

Embodiment 123. The printed circuit board of embodiment 118, wherein the content of the second filler material is not greater than about 20 vol. % for a total volume of the ceramic filler component.

Embodiment 124. The printed circuit board of any one of embodiments 89, 90, and 91, wherein the ceramic filler component is at least about 97% amorphous.

Embodiment 125. The printed circuit board of any one of embodiments 89, 90, and 91, wherein the polymer based core film comprises a porosity of not greater than about 10 vol. %.

Embodiment 126. The printed circuit board of any one of embodiments 89, 90, and 91, wherein the polymer based core film comprises an average thickness of at least about 10 microns.

Embodiment 127. The printed circuit board of any one of embodiments 89, 90, and 91, wherein the polymer based core film comprises an average thickness of not greater than about 2000 microns.

Embodiment 128. The printed circuit board of any one of embodiments 89, 90, and 91, wherein the polymer based core film comprises a dissipation factor (5 GHz, 20% RH) of not greater than about 0.005.

Embodiment 129. The printed circuit board of any one of embodiments 89, 90, and 91, wherein the polymer based core film comprises a dissipation factor (5 GHz, 20% RH) of not greater than about 0.0014.

Embodiment 130. The printed circuit board of any one of embodiments 89, 90, and 91, wherein the polymer based core film comprises a coefficient of thermal expansion (all axes) of not greater than about 80 ppm/° C.

Embodiment 131. The printed circuit board of any one of embodiments 89, 90, and 91, wherein the polymer based core film comprises a moisture absorption of not greater than about 0.05%.

Embodiment 132. The printed circuit board of any one of embodiments 89, 90, and 91, wherein the copper-clad laminate comprises a porosity of not greater than about 10 vol. %.

Embodiment 133. The printed circuit board of any one of embodiments 89, 90, and 91, wherein the copper-clad laminate comprises a peel strength between the copper foil layer and the printed circuit board of at least about 6 lb/in.

Embodiment 134. A method of forming a dielectric substrate, wherein the method comprises: combining a resin matrix precursor component and a ceramic filler precursor component to form a forming mixture; forming the forming mixture into a polymer based core film; and coating the polymer based core film with a fluoropolymer based adhesive layer, wherein the ceramic filler precursor component comprises a first filler precursor material, and wherein a particle size distribution of the first filler precursor material comprises: a $D_{10}$ of at least about 0.5 microns and not greater than about 1.6 microns, a $D_{50}$ of at least about 0.8 microns and not greater than about 2.7 microns, and a $D_{90}$ of at least about 1.5 microns and not greater than about 4.7 microns.

Embodiment 135. A method of forming a dielectric substrate, wherein the method comprises: combining a resin precursor matrix component and a ceramic filler precursor component to form a forming mixture; forming the forming mixture into a polymer based core film; and coating the polymer based core film with a fluoropolymer based adhesive layer, wherein the ceramic filler precursor component comprises a first filler precursor material, wherein the first filler precursor material further comprises a mean particle size of at not greater than about 10 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 136. A method of forming a dielectric substrate, wherein the method comprises: combining a resin matrix precursor component and a ceramic filler precursor component to form a forming mixture; and forming the forming mixture into polymer based core film; and coating the polymer based core film with a fluoropolymer based adhesive layer, wherein the ceramic filler precursor component comprises a first filler precursor material, and wherein the first filler precursor material further comprises a mean particle size of at not greater than about 10 microns, and an average surface area of not greater than about 8 $m^2/g$.

Embodiment 137. The method of any one of embodiments 135 and 136, wherein a particle size distribution of the first filler precursor material comprises a $D_{10}$ of at least about 0.5 microns and not greater than about 1.6 microns.

Embodiment 138. The method of any one of embodiments 135 and 136, wherein a particle size distribution of the first filler precursor material comprises a $D_{50}$ of at least about 0.8 microns and not greater than about 2.7 microns.

Embodiment 139. The method of any one of embodiments 135 and 136, wherein a particle size distribution of the first filler precursor material comprises a $D_{90}$ of at least about 1.5 microns and not greater than about 4.7 microns.

Embodiment 140. The method of embodiment 134, wherein the first filler precursor material further comprises a mean particle size of at not greater than about 10 microns.

Embodiment 141. The method of any one of embodiments 135, 136, and 140, wherein the first filler precursor material comprises a mean particle size of not greater than about 10 microns.

Embodiment 142. The method of any one of embodiments 134 and 136, wherein the first filler precursor material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 143. The method of any one of embodiments 134 and 135, wherein the first filler precursor material further comprises an average surface area of not greater than about 8 $m^2/g$.

Embodiment 144. The method of any one of embodiments 134, 135, and 136, wherein the fluoropolymer based adhesive layer has an average thickness of at least about 0.2 microns.

Embodiment 145. The method of any one of embodiments 134, 135, and 136, wherein the fluoropolymer based adhesive layer has an average thickness of not greater than about 7 microns.

Embodiment 146. The method of any one of embodiments 134, 135, and 136, wherein the fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene.

Embodiment 147. The method of any one of embodiments 134, 135, and 136, wherein the fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene.

Embodiment 148. The method of any one of embodiments 134, 135, and 136, wherein the fluoropolymer based adhesive layer is a PFA layer.

Embodiment 149. The method of any one of embodiments 134, 135, and 136, wherein the first filler precursor material comprises a silica based compound.

Embodiment 150. The method of any one of embodiments 134, 135, and 136, wherein the first filler precursor material comprises silica.

Embodiment 151. The method of any one of embodiments 134, 135, and 136, wherein the resin matrix precursor component comprises a perfluoropolymer.

Embodiment 152. The method of embodiment 151, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 153. The method of embodiment 151, wherein the perfluoropolymer comprises polytetrafluoroethylene (PTFE), perfluoroalkoxy polymer resin (PFA), fluorinated ethylene propylene (FEP), or any combination thereof.

Embodiment 154. The method of embodiment 151, wherein the perfluoropolymer consists of polytetrafluoroethylene (PTFE), perfluoroalkoxy polymer resin (PFA), fluorinated ethylene propylene (FEP), or any combination thereof.

Embodiment 155. The method of any one of embodiments 134, 135, and 136, wherein the content of the resin matrix precursor component.

Embodiment 156. The method of any one of embodiments 134, 135, and 136, wherein the content of the resin matrix precursor component is not greater than about 63 vol. % for a total volume of the forming mixture.

Embodiment 157. The method of embodiment 151, wherein the content of the perfluoropolymer is at least about 45 vol. % for a total volume of the forming mixture.

Embodiment 158. The method of embodiment 151, wherein the content of the perfluoropolymer is not greater than about 63 vol. % for a total volume of the forming mixture.

Embodiment 159. The method of any one of embodiments 134, 135, and 136, wherein the content of the ceramic filler precursor component is at least about 45 vol. % for a total volume of the forming mixture.

Embodiment 160. The method of any one of embodiments 134, 135, and 136, wherein the content of the ceramic filler precursor component is not greater than about 57 vol. % for a total volume of the forming mixture.

Embodiment 161. The method of any one of embodiments 134, 135, and 136, wherein the content of the first filler precursor material is at least about 80 vol. % for a total volume of the ceramic filler precursor component.

Embodiment 162. The method of any one of embodiments 134, 135, and 136, wherein the content of the first filler precursor material is not greater than about 100 vol. % for a total volume of the ceramic filler precursor component.

Embodiment 163. The method of any one of embodiments 134, 135, and 136, wherein the ceramic filler precursor component further comprises a second filler precursor material.

Embodiment 164. The method of embodiment 163, wherein the second filler precursor material comprises a high dielectric constant ceramic material.

Embodiment 165. The method of embodiment 164, wherein the high dielectric constant ceramic material has a dielectric constant of at least about 14.

Embodiment 166. The method of embodiment 164, wherein the ceramic filler precursor component further comprises $TiO_2$, $SrTiO_3$, $ZrTi_2O_6$, $MgTiO_3$, $CaTiO_3$, $BaTiO_4$ or any combination thereof.

Embodiment 167. The method of embodiment 163, wherein the content of the second filler precursor material is at least about 1 vol. % for a total volume of the ceramic filler precursor component.

Embodiment 168. The method of embodiment 163, wherein the content of the second filler precursor material is not greater than about 20 vol. % for a total volume of the ceramic filler precursor component.

Embodiment 169. The method of any one of embodiments 134, 135, and 136, wherein the ceramic filler precursor component is at least about 97% amorphous.

Embodiment 170. The method of any one of embodiments 134, 135, and 136, wherein the polymer based core film comprises a porosity of not greater than about 10 vol. %.

Embodiment 171. The method of any one of embodiments 134, 135, and 136, wherein the polymer based core film comprises an average thickness of at least about 10 microns.

Embodiment 172. The method of any one of embodiments 134, 135, and 136, wherein the polymer based core film comprises an average thickness of not greater than about 2000 microns.

Embodiment 173. The method of any one of embodiments 134, 135, and 136, wherein the polymer based core film comprises a dissipation factor (5 GHz, 20% RH) of not greater than about 0.005.

Embodiment 174. The method of any one of embodiments 134, 135, and 136, wherein the polymer based core film comprises a dissipation factor (5 GHz, 20% RH) of not greater than about 0.0014.

Embodiment 175. The method of any one of embodiments 134, 135, and 136, wherein the polymer based core film comprises a coefficient of thermal expansion (all axes) of not greater than about 80 ppm/° C.

Embodiment 176. The method of any one of embodiments 134, 135, and 136, wherein the polymer based core film comprises a moisture absorption of not greater than about 0.05%.

Embodiment 177. A method of forming a copper-clad laminate, wherein the method comprises: providing a copper foil layer; combining a resin matrix precursor component and a ceramic filler precursor component to form a forming mixture; forming the forming mixture into a polymer based core film; and providing a fluoropolymer based adhesive layer between the polymer based core film and the copper foil layer, wherein the ceramic filler precursor component comprises a first filler precursor material, and wherein a particle size distribution of the first filler precursor material comprises: a $D_{10}$ of at least about 0.5 microns and not greater than about 1.6 microns, a $D_{50}$ of at least about 0.8 microns and not greater than about 2.7 microns, and a $D_{90}$ of at least about 1.5 microns and not greater than about 4.7 microns.

Embodiment 178. A method of forming a copper-clad laminate, wherein the method comprises: providing a copper foil layer; combining a resin matrix precursor component and a ceramic filler precursor component to form a forming mixture; forming the forming mixture into a polymer based core film; and providing a fluoropolymer based adhesive layer between the polymer based core film and the copper foil layer, wherein the ceramic filler precursor component comprises a first filler precursor material, wherein the first filler precursor material further comprises a mean particle size of at not greater than about 10 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 179. A method of forming a copper-clad laminate, wherein the method comprises: providing a copper foil layer; combining a resin matrix precursor component and a ceramic filler precursor component to form a forming mixture; forming the forming mixture into polymer based core film; and providing a fluoropolymer based adhesive layer between the polymer based core film and the copper foil layer, wherein the ceramic filler precursor component comprises a first filler precursor material, and wherein the first filler precursor material further comprises a mean particle size of at not greater than about 10 microns, and an average surface area of not greater than about 8 $m^2/g$.

Embodiment 180. The method of any one of embodiments 178 and 179, wherein a particle size distribution of the first filler precursor material comprises a $D_{10}$ of at least about 0.5 microns and not greater than about 1.6 microns.

Embodiment 181. The method of any one of embodiments 178 and 179, wherein a particle size distribution of the first filler precursor material comprises a $D_{50}$ of at least about 0.8 microns and not greater than about 2.7 microns.

Embodiment 182. The method of any one of embodiments 178 and 179, wherein a particle size distribution of the first filler precursor material comprises a $D_{90}$ of at least about 1.5 microns and not greater than about 4.7 microns.

Embodiment 183. The method of embodiment 182, wherein the first filler precursor material further comprises a mean particle size of at not greater than about 10 microns.

Embodiment 184. The method of any one of embodiments 177, 178, and 179, wherein the first filler precursor material comprises a mean particle size of not greater than about 10 microns.

Embodiment 185. The method of any one of embodiments 177 and 179, wherein the first filler precursor material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 186. The method of any one of embodiments 177 and 179, wherein the first filler precursor material further comprises an average surface area of not greater than about 8 $m^2/g$.

Embodiment 187. The method of any one of embodiments 177, 178, and 179, wherein the fluoropolymer based adhesive layer has an average thickness of at least about 0.2 microns.

Embodiment 188. The method of any one of embodiments 177, 178, and 179, wherein the fluoropolymer based adhesive layer has an average thickness of not greater than about 7 microns.

Embodiment 189. The method of any one of embodiments 177, 178, and 179, wherein the fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene.

Embodiment 190. The method of any one of embodiments 177, 178, and 179, wherein the fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene.

Embodiment 191. The method of any one of embodiments 177, 178, and 179, wherein the fluoropolymer based adhesive layer is a PFA layer.

Embodiment 192. The method of any one of embodiments 177, 178, and 179, wherein the first filler precursor material comprises a silica based compound.

Embodiment 193. The method of any one of embodiments 177, 178, and 179, wherein the first filler precursor material comprises silica.

Embodiment 194. The method of any one of embodiments 177, 178, and 179, wherein the resin matrix comprises a perfluoropolymer.

Embodiment 195. The method of embodiment 194, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 196. The method of embodiment 194, wherein the perfluoropolymer comprises polytetrafluoroethylene (PTFE), perfluoroalkoxy polymer resin (PFA), fluorinated ethylene propylene (FEP), or any combination thereof.

Embodiment 197. The method of embodiment 194, wherein the perfluoropolymer consists of polytetrafluoroethylene (PTFE), perfluoroalkoxy polymer resin (PFA), fluorinated ethylene propylene (FEP), or any combination thereof.

Embodiment 198. The method of any one of embodiments 177, 178, and 179, wherein the content of the resin matrix precursor component is at least about 45 vol. % for a total volume of the polymer based core film.

Embodiment 199. The method of any one of embodiments 177, 178, and 179, wherein the content of the resin matrix precursor component is not greater than about 63 vol. % for a total volume of the polymer based core film.

Embodiment 200. The method of embodiment 194, wherein the content of the perfluoropolymer is at least about 45 vol. % for a total volume of the polymer based core film.

Embodiment 201. The method of embodiment 194, wherein the content of the perfluoropolymer is not greater than about 63 vol. % for a total volume of the polymer based core film.

Embodiment 202. The method of any one of embodiments 177, 178, and 179, wherein the content of the ceramic filler precursor component is at least about 45 vol. % for a total volume of the polymer based core film.

Embodiment 203. The method of any one of embodiments 177, 178, and 179, wherein the content of the ceramic filler precursor component is not greater than about 57 vol. % for a total volume of the polymer based core film.

Embodiment 204. The method of any one of embodiments 177, 178, and 179, wherein the content of the first filler precursor material is at least about 80 vol. % for a total volume of the ceramic filler precursor component.

Embodiment 205. The method of any one of embodiments 177, 178, and 179, wherein the content of the first filler precursor material is not greater than about 100 vol. % for a total volume of the ceramic filler precursor component.

Embodiment 206. The method of any one of embodiments 177, 178, and 179, wherein the ceramic filler precursor component further comprises a second filler material.

Embodiment 207. The method of embodiment 194, wherein the second filler material comprises a high dielectric constant ceramic material.

Embodiment 208. The method of embodiment 195, wherein the high dielectric constant ceramic material has a dielectric constant of at least about 14.

Embodiment 209. The method of embodiment 195, wherein the ceramic filler precursor component further comprises $TiO_2$, $SrTiO_3$, $ZrTi_2O_6$, $MgTiO_3$, $CaTiO_3$, $BaTiO_4$ or any combination thereof.

Embodiment 210. The method of embodiment 194, wherein the content of the second filler material is at least about 1 vol. % for a total volume of the ceramic filler precursor component.

Embodiment 211. The method of embodiment 194, wherein the content of the second filler material is not greater than about 20 vol. % for a total volume of the ceramic filler precursor component.

Embodiment 212. The method of any one of embodiments 177, 178, and 179, wherein the ceramic filler precursor component is at least about 97% amorphous.

Embodiment 213. The method of any one of embodiments 177, 178, and 179, wherein the polymer based core film comprises a porosity of not greater than about 10 vol. %.

Embodiment 214. The method of any one of embodiments 177, 178, and 179, wherein the polymer based core film comprises an average thickness of at least about 10 microns.

Embodiment 215. The method of any one of embodiments 177, 178, and 179, wherein the polymer based core film comprises an average thickness of not greater than about 2000 microns.

Embodiment 216. The method of any one of embodiments 177, 178, and 179, wherein the polymer based core film comprises a dissipation factor (5 GHz, 20% RH) of not greater than about 0.005.

Embodiment 217. The method of any one of embodiments 177, 178, and 179, wherein the polymer based core film comprises a dissipation factor (5 GHz, 20% RH) of not greater than about 0.0014.

Embodiment 218. The method of any one of embodiments 177, 178, and 179, wherein the polymer based core film comprises a coefficient of thermal expansion (all axes) of not greater than about 80 ppm/° C.

Embodiment 219. The method of any one of embodiments 177, 178, and 179, wherein the polymer based core film comprises a moisture absorption of not greater than about 0.05%.

Embodiment 220. The method of any one of embodiments 177, 178, and 179, wherein the copper-clad laminate comprises a porosity of not greater than about 10 vol. %.

Embodiment 221. The method of any one of embodiments 177, 178, and 179, wherein the copper-clad laminate comprises a peel strength between the copper foil layer and the dielectric substrate of at least about 6 lb/in.

Embodiment 222. A method of forming a printed circuit board, wherein the method comprises: providing a copper foil layer; combining a resin matrix precursor component and a ceramic filler precursor component to form a forming mixture; forming the forming mixture into polymer based core film; and providing a fluoropolymer based adhesive layer between the polymer based core film and the copper foil layer, wherein the ceramic filler precursor component comprises a first filler precursor material, and wherein a particle size distribution of the first filler precursor material comprises: a $D_{10}$ of at least about 0.5 microns and not greater than about 1.6 microns, a $D_{50}$ of at least about 0.8 microns and not greater than about 2.7 microns, and a $D_{90}$ of at least about 1.5 microns and not greater than about 4.7 microns.

Embodiment 223. A method of forming a printed circuit board, wherein the method comprises: providing a copper foil layer; combining a resin matrix precursor component and a ceramic filler precursor component to form a forming mixture; forming the forming mixture into a polymer based core film; and providing a fluoropolymer based adhesive layer between the polymer based core film and the copper foil layer, wherein the ceramic filler precursor component comprises a first filler precursor material, wherein the first filler precursor material further comprises a mean particle size of at not greater than about 10 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 224. A method of forming a printed circuit board, wherein the method comprises: providing a copper foil layer; combining a resin matrix precursor component and a ceramic filler precursor component to form a forming mixture; forming the forming mixture into polymer based core film; and providing a fluoropolymer based adhesive layer between the polymer based core film and the copper foil layer; wherein the ceramic filler precursor component comprises a first filler precursor material, and wherein the first filler precursor material further comprises a mean particle size of at not greater than about 10 microns, and an average surface area of not greater than about 8 m²/g.

Embodiment 225. The method of any one of embodiments 223 and 224, wherein a particle size distribution of the first filler precursor material comprises a $D_{10}$ of at least about 0.5 microns and not greater than about 1.6 microns.

Embodiment 226. The method of any one of embodiments 223 and 224, wherein a particle size distribution of the first filler precursor material comprises a $D_{50}$ of at least about 0.8 microns and not greater than about 2.7 microns.

Embodiment 227. The method of any one of embodiments 223 and 224, wherein a particle size distribution of the first filler precursor material comprises a $D_{90}$ of at least about 1.5 microns and not greater than about 4.7 microns.

Embodiment 228. The method of embodiment 227, wherein the first filler precursor material further comprises a mean particle size of at not greater than about 10 microns.

Embodiment 229. The method of any one of embodiments 222, 223, and 224, wherein the first filler precursor material comprises a mean particle size of not greater than about 10 microns.

Embodiment 230. The method of any one of embodiments 222 and 224, wherein the first filler precursor material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 231. The method of any one of embodiments 222 and 224, wherein the first filler precursor material further comprises an average surface area of not greater than about 8 m²/g.

Embodiment 232. The method of any one of embodiments 222, 223, and 224, wherein the fluoropolymer based adhesive layer has an average thickness of at least about 0.2 microns.

Embodiment 233. The method of any one of embodiments 222, 223, and 224, wherein the fluoropolymer based adhesive layer has an average thickness of not greater than about 7 microns.

Embodiment 234. The method of any one of embodiments 222, 223, and 224, wherein the fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene.

Embodiment 235. The method of any one of embodiments 222, 223, and 224, wherein the fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer 207 may consist of fluoropolymers (e.g., polytetrafluoroethylene (PTFE), modified polytetrafluoroethylene.

Embodiment 236. The method of any one of embodiments 222, 223, and 224, wherein the fluoropolymer based adhesive layer is a PFA layer.

Embodiment 237. The method of any one of embodiments 222, 223, and 224, wherein the first filler precursor material comprises a silica based compound.

Embodiment 238. The method of any one of embodiments 222, 223, and 224, wherein the first filler precursor material comprises silica.

Embodiment 239. The method of any one of embodiments 222, 223, and 224, wherein the resin matrix comprises a perfluoropolymer.

Embodiment 240. The method of embodiment 239, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 241. The method of embodiment 239, wherein the perfluoropolymer comprises polytetrafluoroethylene (PTFE), perfluoroalkoxy polymer resin (PFA), fluorinated ethylene propylene (FEP), or any combination thereof.

Embodiment 242. The method of embodiment 239, wherein the perfluoropolymer consists of polytetrafluoroethylene (PTFE), perfluoroalkoxy polymer resin (PFA), fluorinated ethylene propylene (FEP), or any combination thereof.

Embodiment 243. The method of any one of embodiments 222, 223, and 224, wherein the content of the resin matrix precursor component is at least about 45 vol. % for a total volume of the polymer based core film.

Embodiment 244. The method of any one of embodiments 222, 223, and 224, wherein the content of the resin matrix precursor component is not greater than about 63 vol. % for a total volume of the polymer based core film.

Embodiment 245. The method of embodiment 239, wherein the content of the perfluoropolymer is at least about 45 vol. % for a total volume of the polymer based core film.

Embodiment 246. The method of embodiment 239, wherein the content of the perfluoropolymer is not greater than about 63 vol. % for a total volume of the polymer based core film.

Embodiment 247. The method of any one of embodiments 222, 223, and 224, wherein the content of the ceramic filler precursor component is at least about 45 vol. % for a total volume of the polymer based core film.

Embodiment 248. The method of any one of embodiments 222, 223, and 224, wherein the content of the ceramic filler precursor component is not greater than about 57 vol. % for a total volume of the polymer based core film.

Embodiment 249. The method of any one of embodiments 222, 223, and 224, wherein the content of the first filler precursor material is at least about 80 vol. % for a total volume of the ceramic filler precursor component.

Embodiment 250. The method of any one of embodiments 222, 223, and 224, wherein the content of the first filler precursor material is not greater than about 100 vol. % for a total volume of the ceramic filler precursor component.

Embodiment 251. The method of any one of embodiments 222, 223, and 224, wherein the ceramic filler precursor component further comprises a second filler material.

Embodiment 252. The method of embodiment 239, wherein the second filler material comprises a high dielectric constant ceramic material.

Embodiment 253. The method of embodiment 240, wherein the high dielectric constant ceramic material has a dielectric constant of at least about 14.

Embodiment 254. The method of embodiment 240, wherein the ceramic filler precursor component further comprises $TiO_2$, $SrTiO_3$, $ZrTi_2O_6$, $MgTiO_3$, $CaTiO_3$, $BaTiO_4$ or any combination thereof.

Embodiment 255. The method of embodiment 239, wherein the content of the second filler material is at least about 1 vol. % for a total volume of the ceramic filler precursor component.

Embodiment 256. The method of embodiment 239, wherein the content of the second filler material is not greater than about 20 vol. % for a total volume of the ceramic filler precursor component.

Embodiment 257. The method of any one of embodiments 222, 223, and 224, wherein the ceramic filler precursor component is at least about 97% amorphous.

Embodiment 258. The method of any one of embodiments 222, 223, and 224, wherein the polymer based core film comprises a porosity of not greater than about 10 vol. %.

Embodiment 259. The method of any one of embodiments 222, 223, and 224, wherein the polymer based core film comprises an average thickness of at least about 10 microns.

Embodiment 260. The method of any one of embodiments 222, 223, and 224, wherein the polymer based core film comprises an average thickness of not greater than about 2000 microns.

Embodiment 261. The method of any one of embodiments 222, 223, and 224, wherein the polymer based core film comprises a dissipation factor (5 GHz, 20% RH) of not greater than about 0.005.

Embodiment 262. The method of any one of embodiments 222, 223, and 224, wherein the polymer based core film comprises a dissipation factor (5 GHz, 20% RH) of not greater than about 0.0014.

Embodiment 263. The method of any one of embodiments 222, 223, and 224, wherein the polymer based core film comprises a coefficient of thermal expansion (all axes) of not greater than about 80 ppm/° C.

Embodiment 264. The method of any one of embodiments 222, 223, and 224, wherein the polymer based core film comprises a moisture absorption of not greater than about 0.05%.

Embodiment 265. The method of any one of embodiments 222, 223, and 224, wherein the copper-clad laminate comprises a porosity of not greater than about 10 vol. %.

Embodiment 266. The method of any one of embodiments 222, 223, and 224, wherein the copper-clad laminate comprises a peel strength between the copper foil layer and the dielectric substrate of at least about 6 lb/in.

EXAMPLES

The concepts described herein will be further described in the following Examples, which do not limit the scope of the invention described in the claims.

Example 1

Sample dielectric substrates S1-S12 were configured and formed according to certain embodiments described herein.

Each sample dielectric substrate was formed using a cast film process where a fluoropolymer pre-treated polyimide carrier belt is passed through a dip pan containing an aqueous forming mixture (i.e. the combination of the resin matrix component and the ceramic filler component) at the base of the coating tower. The coated carrier belt then passes through a metering zone in which metering bars remove excess dispersion from the coated carrier belt. After the metering zone, the coated carrier belt passes into a drying zone maintained at a temperature between 82° C. and 121° C. to evaporate the water. The coated carrier belt with the dried film then passes through a bake zone maintained at a temperature between 315° C. and 343° C. Finally, the carrier belt passes through a fusing zone maintained at a temperature between 349° C. and 399° C. to sinter, i.e. coalesce, the resin matrix material. The coated carrier belt then passes through a cooling plenum from which it can be directed either to a subsequent dip pan to begin formation of a further layer of the film or to a stripping apparatus. When the desired film thickness is achieved, the films are stripped off of the carrier belt.

The resin matrix component for each sample dielectric substrates S1-S12 is polytetrafluoroethylene (PTFE). Further configuration and composition details of each dielectric substrate S1-S12 are summarized in Table 1 below.

TABLE 1

Sample Dielectric Substrate Configuration and Composition

| | | | Dielectric Substrate Composition | | | |
|---|---|---|---|---|---|---|
| Sample No. | Sample Thickness (mil) | Silica Based Component Type | Ceramic Filler Component (vol. % of dielectric substrate) | Resin Matrix Component (vol. % of dielectric substrate) | First Filler Material- Silica Based Component (vol. % of Ceramic Filler Component) | Second Ceramic Filler Material (TiO$_2$) (vol. % of Ceramic Filler Component) |
| S1 | 5 | A | 54.4 | 45.6 | 96.1 | 3.9 |
| S2 | 5 | A | 54.4 | 45.6 | 96.1 | 3.9 |
| S3 | 5 | A | 54.4 | 45.6 | 96.1 | 3.9 |
| S4 | 3 | A | 54.4 | 45.6 | 96.1 | 3.9 |
| S5 | 4 | A | 54.4 | 45.6 | 100.00 | 0.0 |
| S6 | 4 | A | 54.4 | 45.6 | 100.0 | 0.0 |
| S7 | 4 | A | 54.4 | 45.6 | 100.0 | 0.0 |
| S8 | 4 | A | 54.4 | 45.6 | 100.0 | 0.0 |
| S9 | 2 | A | 55.0 | 45.0 | 100.0 | 0.0 |
| S10 | 2 | B | 54.4 | 45.6 | 100.0 | 0.0 |
| S11 | 4 | A | 48.0 | 52.0 | 100.0 | 0.0 |
| S12 | 4 | A | 48.0 | 52.0 | 100.0 | 0.0 |

*Characteristics, including particle size distribution measurements (i.e. $D_{10}$, $D_{50}$ & $D_{90}$), particle size distribution span, mean particle size, and BET surface area, of the silica based component types used in the sample dielectric substrates S1-S12 are summarized in Table 2 below.*

TABLE 2

*TABLE 2 - Silica Based Component Characteristics*

| Silica Based Component Type | $D_{10}$ (μm) | $D_{50}$ (μm) | $D_{90}$ (μm) | *PSDS* ($D_{90}$-$D_{10}$)/$D_{50}$ | *Mean Particle Size (μm)* | *BET Surface Area (m$^2$/g)* |
|---|---|---|---|---|---|---|
| *A* | *1.3* | *2.3* | *3.9* | *1.13* | *2.3-3.0* | *2.2-2.5* |
| *B* | *0.5* | *1.1* | *1.6* | *1.0* | *1.0-1.9* | *6.1* |

*Performance properties of each sample dielectric substrates S1-S12 are summarized in Table 3 below. The summarized performance properties include the permittivity of the sample dielectric substrate measured at 5 GHz ("Dk (5 GHz)"), the dissipation factor of the substrate measured at 5 GHz, 20% RH ("Df (5 GHz, 20% RH)"), the dissipation factor of the sample dielectric substrate measured at 5 GHz, 80% RH ("Df (5 GHz, 80% RH)"), and the coefficient of thermal expansion of the sample dielectric substrate ("CTE")*

TABLE 3

Performance Properties

| Sample No. | Dk (5 GHz) | Df (5 GHz, 20% RH) | Df (5 GHz, 80% RH) | CTE (ppm/° C.) |
|---|---|---|---|---|
| S1 | 3.02 | 0.0005 | 0.0006 | 29 |
| S2 | 3.00 | 0.0005 | 0.0007 | 28 |
| S3 | 3.02 | 0.0005 | 0.0006 | 25 |
| S4 | 2.95 | 0.0004 | 0.0006 | 20 |
| S5 | 2.76 | 0.0004 | 0.0005 | 29 |
| S6 | 2.78 | 0.0004 | 0.0005 | 19 |
| S7 | 2.73 | 0.0005 | 0.0006 | 26 |
| S8 | 2.75 | 0.0004 | 0.0006 | 31 |
| S9 | 2.78 | 0.0005 | 0.0006 | 30 |
| S10 | 2.70 | 0.0007 | 0.0010 | 34 |
| S11 | 2.68 | 0.0005 | 0.0006 | 54 |
| S12 | 2.72 | 0.0004 | 0.0007 | 58 |

Example 2

For purposes of comparison, comparative sample dielectric substrates CS1-CS10 were configured and formed.

Each comparative sample dielectric substrate was formed using a cast film process where a fluoropolymer pre-treated polyimide carrier belt is passed through a dip pan containing an aqueous forming mixture (i.e. the combination of the resin matrix component and the ceramic filler component) at the base of the coating tower. The coated carrier belt then passes through a metering zone in which metering bars remove excess dispersion from the coated carrier belt. After the metering zone, the coated carrier belt passes into a drying zone maintained at a temperature between 82° C. and 121° C. to evaporate the water. The coated carrier belt with the dried film then passes through a bake zone maintained at a temperature between 315° C. and 343° C. Finally, the carrier belt passes through a fusing zone maintained at a temperature between 349° C. and 399° C. to sinter, i.e. coalesce, the resin matrix material. The coated carrier belt then passes through a cooling plenum from which it can be directed either to a subsequent dip pan to begin formation of a further layer of the film or to a stripping apparatus. When the desired film thickness is achieved, the films are stripped off of the carrier belt.

The resin matrix component for each comparative sample dielectric substrates CS1-CS10 is polytetrafluoroethylene (PTFE). Further configuration and composition details of each dielectric substrate CS1-CS10 are summarized in Table 4 below.

TABLE 4

Comparative Sample Dielectric Substrate Configuration and Composition

| | | | Dielectric Substrate Composition | | | |
|---|---|---|---|---|---|---|
| Sample No. | Sample Thickness (mil) | Silica Based Component Type | Ceramic Filler Component (vol. % of dielectric substrate) | Resin Matrix Component (vol. % of dielectric substrate) | First Filler Material -Silica Based Component (vol. % of Ceramic Filler Component) | Second Ceramic Filler Material (TiO$_2$) (vol. % of Ceramic Filler Component) |
| CS1 | 5 | CA | 55.0 | 45.0 | 100.0 | 0.0 |
| CS2 | 5 | CB | 50.0 | 50.0 | 100.0 | 0.0 |
| CS3 | 5 | CA | 50.0 | 50.0 | 100.0 | 0.0 |
| CS4 | 5 | CC | 54.4 | 45.6 | 96.1 | 3.9 |
| CS5 | 5 | CA | 50.0 | 50.0 | 98.0 | 2.0 |
| CS6 | 5 | CA | 50.0 | 50.0 | 90.0 | 10.0 |
| CS7 | 5 | CA | 52.0 | 48.0 | 96.2 | 3.8 |
| CS8 | 5 | CA | 53.0 | 47.0 | 93.4 | 6.6 |
| CS9 | 5 | CA | 54.0 | 46.0 | 95.9 | 4.1 |

*Characteristics, including particle size distribution measurements (i.e. $D_{10}$, $D_{50}$, & $D_{90}$), particle size distribution span, mean particle size and BET surface area, of the silica based component types used in the sample dielectric substrates CS1-CS9 are summarized in Table 2 below.*

TABLE 5

*TABLE 5 - Silica Based Component Characteristics*

| Silica Based Component Type | $D_{10}$ (μm) | $D_{50}$ (μm) | $D_{90}$ (μm) | PSDS ($D_{90}$-$D_{10}$)/$D_{50}$ | Mean Particle Size (μm) | BET Surface Area (m$^2$/g) |
|---|---|---|---|---|---|---|
| *CA* | *4.9* | *13.9* | *30.4* | *1.83* | *16.3* | *3.3* |
| *CB* | *4.1* | *7.3* | *12.6* | *1.16* | *7.9* | *4.6* |
| *CC* | *4.6* | *6.9* | *11.1* | *0.94* | *7.5* | *2.6* |

*Performance properties of each sample dielectric substrates CS1-S9 are summarized in Table 6 below. The summarized performance properties include the permittivity of the sample dielectric substrate measured at 5 GHz ("Dk (5 GHz)"), the dissipation factor of the substrate measurement at 5 Ghz, 20% RH ("Df (5 GHz, 20% RH)"), the dissipation factor of the sample dielectric substrate measured 80% RH")", and the coefficient of thermal expansion of the sample dielectric substrate ("CTE").*

TABLE 6

| | Performance Properties | | | |
|---|---|---|---|---|
| Sample No. | Dk (5 GHz) | Df (5 GHz, 20% RH) | Df (5 GHz, 80% RH) | CTE (ppm/° C.) |
| CS1 | 2.55 | 0.0006 | 0.0009 | 25 |
| CS2 | 2.60 | 0.0008 | 0.0009 | 24 |
| CS3 | 2.53 | 0.0008 | 0.0018 | 31 |
| CS4 | 3.02 | 0.0005 | 0.0005 | 56 |
| CS5 | 2.64 | 0.0012 | 0.0026 | 30 |
| CS6 | 3.04 | 0.0017 | 0.0025 | 40 |
| CS7 | 2.71 | 0.0008 | 0.0013 | 36 |
| CS8 | 2.83 | 0.0015 | 0.0026 | 42 |
| CS9 | 2.82 | 0.0007 | 0.0014 | 31 |

Example 3

Sample dielectric substrates S13-S28 were configured and formed according to certain embodiments described herein.

Each sample dielectric substrate was formed using a cast film process where a fluoropolymer pre-treated polyimide carrier belt is passed through a dip pan containing an aqueous forming mixture (i.e. the combination of the resin matrix component and the ceramic filler component) at the base of the coating tower. The coated carrier belt then passes through a metering zone in which metering bars remove excess dispersion from the coated carrier belt. After the metering zone, the coated carrier belt passes into a drying zone maintained at a temperature between 82° C. and 121° C. to evaporate the water. The coated carrier belt with the dried film then passes through a bake zone maintained at a temperature between 315° C. and 343° C. Finally, the carrier belt passes through a fusing zone maintained at a temperature between 349° C. and 399° C. to sinter, i.e. coalesce, the resin matrix material. The coated carrier belt then passes through a cooling plenum from which it can be directed either to a subsequent dip pan to begin formation of a further layer of the film or to a stripping apparatus. When the desired film thickness is achieved, the films are stripped off of the carrier belt.

The resin matrix component for each sample dielectric substrates S13-S28 is polytetrafluoroethylene (PTFE). Further configuration and composition details of each dielectric substrate S13-S28, including details regarding the bonding layer type, thickness and percent, are summarized in Table 7 below.

TABLE 7

Sample Dielectric Substrate Configuration and Composition

| | | Dielectric Substrate Composition | | | | | | |
|---|---|---|---|---|---|---|---|---|
| Sample No. | Sample Thickness (mil) | Silica Based Component Type | Ceramic Filler Component (vol.% of dielectric substrate) | Resin Matrix Component (vol.% of dielectric substrate) | First Filler Material-Silica Based Component (vol.% of Ceramic Filler Component) | Second Ceramic Filler Material ($TiO_2$) (vol.% of Ceramic Filler Component) | Bonding Layer | |
| | | | | | | | Type | Thickness (μm) | Percent (%) |
| S13 | 4 | A | 54.0 | 46.0 | 100.0 | 0.0 | PFA | 1.5 | 3.0 |
| S14 | 6 | A | 54.0 | 46.0 | 100.0 | 0.0 | PFA | 1.4 | 1.8 |
| S15 | 4 | A | 54.0 | 46.0 | 100.0 | 0.0 | PFA | 1.6 | 3.1 |
| S16 | 6 | A | 54.0 | 46.0 | 96.3 | 3.7 | PFA | — | — |
| S17 | 4 | A | 50.0 | 50.0 | 100.0 | 0.0 | PFA | 0.5 | 1.0 |
| S18 | 4 | A | 50.0 | 50.0 | 100.0 | 0.0 | PFA | 2.4 | 4.7 |
| S19 | 4 | A | 54.0 | 46.0 | 100.0 | 0.0 | PFA | 2.8 | 5.5 |
| S20 | 6 | A | 54.0 | 46.0 | 100.0 | 0.0 | PFA | 2.7 | 3.5 |
| S21 | 6 | A | 54.0 | 46.0 | 100.0 | 0.0 | PFA | 2.5 | 3.3 |
| S22 | 4 | A | 54.0 | 46.0 | 100.0 | 0.0 | PFA | 2.0 | 3.9 |
| S23 | 4 | A | 54.0 | 46.0 | 100.0 | 0.0 | PFA | 1.5 | 3.0 |
| S24 | 4 | A | 54.0 | 46.0 | 100.0 | 0.0 | PFA | 1.6 | 3.1 |
| S25 | 6 | A | 54.0 | 46.0 | 100.0 | 0.0 | PFA | 1.6 | 2.1 |
| S26 | 4 | A | 54.0 | 46.0 | 100.0 | 0.0 | PFA | 1.8 | 3.5 |
| S27 | 4 | A | 54.0 | 46.0 | 100.0 | 0.0 | PFA | 1.0 | 2.0 |
| S28 | 6 | A | 54.0 | 46.0 | 96.3 | 3.7 | PFA | 1.0 | 1.3 |

*Characteristics, including particle size distribution measurements (i.e. $D_{10}$, $D_{50}$, & $D_{90}$), particle size distribution span, mean particle size, and BET surface area, of the silica based component types used in the sample dielectric substrates* S13-S28 *are summarized in Table 2 above. Performance properties of each sample dielectric substrates* S13-S28 *are summarized in Table 8 below. The summarized performance properties include the permittivity of the sample dielectric substrate measured at 5 GHz ("Dk (5 GHz)"), the dissipation factor of the substrate measured at 5 GHz, 20% RH ("Df (5 GHz, 20% RH)"), the dissipation factor of the sample dielectric substrate measured at 5 GHz, 80% RH ("Df (5 GHz, 80% RH)"), and the coefficient of thermal expansion of the sample delectric substrate ("CTE").*

TABLE 8

Performance Properties

| Sample No. | Dk (5 GHz) | Df (5 GHz, 20% RH) | Df (5 GHz, 80% RH) | CTE (ppm/° C.) |
|---|---|---|---|---|
| S13 | 2.74 | 0.0004 | 0.0005 | 53 |
| S14 | 2.77 | 0.0005 | 0.0006 | 54 |
| S15 | 2.78 | 0.0004 | 0.0006 | 58 |
| S16 | 2.92 | 0.0006 | 0.0007 | 46 |
| S17 | 2.72 | 0.0004 | 0.0007 | 64 |
| S18 | 2.68 | 0.0005 | 0.0005 | 69 |
| S19 | 2.70 | 0.0005 | 0.0007 | 61 |
| S20 | 2.69 | 0.0005 | 0.0005 | 57 |
| S21 | 2.72 | 0.0005 | 0.0005 | 63 |
| S22 | 2.76 | 0.0005 | 0.0006 | 58 |
| S23 | 2.71 | 0.0004 | 0.0006 | 51 |
| S24 | 2.71 | 0.0004 | 0.0006 | 64 |
| S25 | 2.73 | 0.0004 | 0.0006 | 58 |
| S26 | 2.73 | 0.0005 | 0.0006 | 61 |
| S27 | 2.72 | 0.0004 | 0.0005 | 62 |
| S28 | 2.98 | 0.0006 | 0.0007 | 52 |

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A dielectric substrate comprising:
   a polymer based core film, and
   a fluoropolymer based adhesive layer,
   wherein the polymer based core film comprises:
      a resin matrix component; and
      a ceramic filler component,
      wherein the ceramic filler component comprises a first filler material, and
      wherein a particle size distribution of the first filler material comprises:
         a $D_{10}$ of at least about 0.5 microns and not greater than about 1.6 microns,
         a $D_{50}$ of at least about 0.8 microns and not greater than about 2.7 microns, and
         a $D_{90}$ of at least about 1.5 microns and not greater than about 4.7 microns.

2. The dielectric substrate of claim 1, wherein the first filler material further comprises a mean particle size of at not greater than about 10 microns.

3. The dielectric substrate of claim 1, wherein the first filler material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

4. The dielectric substrate of claim 1, wherein the first filler material further comprises an average surface area of not greater than about 8 $m^2/g$.

5. The dielectric substrate of claim 1, wherein the first filler material comprises a silica based compound.

6. The dielectric substrate of claim 1, wherein the resin matrix comprises a perfluoropolymer.

7. The dielectric substrate of claim 6, wherein the perfluoropolymer comprises a copolymer of tetrafluoroethylene (TFE); a copolymer of hexafluoropropylene (HFP); a terpolymer of tetrafluoroethylene (TFE); or any combination thereof.

8. The dielectric substrate of claim 6, wherein the perfluoropolymer comprises polytetrafluoroethylene (PTFE), perfluoroalkoxy polymer resin (PFA), fluorinated ethylene propylene (FEP), or any combination thereof.

9. The dielectric substrate of claim 1, wherein the content of the resin matrix component is at least about 45 vol. % and not greater than about 63 vol. % for a total volume of the polymer based core film.

10. The dielectric substrate of claim 1, wherein the content of the ceramic filler component is at least about 45 vol. % and not greater than about 57 vol. % for a total volume of the polymer based core film.

11. The dielectric substrate of claim 1, wherein the content of the first filler material is at least about 80 vol. % and not greater than about 100 vol. % for a total volume of the ceramic filler component.

12. The dielectric substrate of claim 1, wherein the dielectric substrate comprises a dissipation factor (5 GHz, 20% RH) of not greater than about 0.005.

13. The dielectric substrate of claim 1, wherein the dielectric substrate comprises a dissipation factor (5 GHz, 20% RH) of not greater than about 0.0014.

14. A copper-clad laminate comprising:
    a copper foil layer, and a dielectric substrate overlying the copper foil layer,
    wherein the dielectric substrate comprises:
       a polymer based core film, and
       a fluoropolymer based adhesive layer,
       wherein the polymer based core film comprises:
          a resin matrix component; and
          a ceramic filler component,
          wherein the ceramic filler component comprises a first filler material, and
          wherein a particle size distribution of the first filler material comprises:
             a $D_{10}$ of at least about 0.5 microns and not greater than about 1.6 microns,
             a $D_{50}$ of at least about 0.8 microns and not greater than about 2.7 microns, and
             a $D_{90}$ of at least about 1.5 microns and not greater than about 4.7 microns.

15. The copper-clad laminate of claim 14, wherein the first filler material further comprises a mean particle size of at not greater than about 10 microns.

16. The copper-clad laminate of claim 14, wherein the first filler material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

17. The copper-clad laminate of claim 14, wherein the first filler material further comprises an average surface area of not greater than about 8 $m^2/g$.

18. A printed circuit board comprising a copper-clad laminate, wherein the copper-clad laminate comprises:
    a copper foil layer, and a dielectric substrate overlying the copper foil layer,
    wherein the dielectric substrate comprises:
       a polymer based core film, and
       a fluoropolymer based adhesive layer,
       wherein the polymer based core film comprises:
          a resin matrix component; and
          a ceramic filler component,
          wherein the ceramic filler component comprises a first filler material, and
          wherein a particle size distribution of the first filler material comprises:
             a $D_{10}$ of at least about 0.5 microns and not greater than about 1.6 microns, a $D_{50}$ of at least about 0.8 microns and not greater than about 2.7 microns, and a $D_{90}$ of at least about 1.5 microns and not greater than about 4.7 microns.

19. The printed circuit board of claim 18, wherein the first filler material comprises a silica based compound.

20. The printed circuit board of claim 18, wherein the first filler material comprises silica.

* * * * *